(12) United States Patent
Lemke et al.

(10) Patent No.: US 6,398,558 B1
(45) Date of Patent: Jun. 4, 2002

(54) ELECTRICAL CONNECTOR AND CONTACT THEREFOR

(75) Inventors: Timothy A. Lemke, Dillsburg; Timothy W. Houtz, Etters; Lewis R. Johnson, Liverpool, all of PA (US)

(73) Assignee: FCI Americas Technology, Inc., Reno, NV (US)

( * ) Notice: Subject to any disclaimer, the term of this patent is extended or adjusted under 35 U.S.C. 154(b) by 0 days.

(21) Appl. No.: 09/557,602

(22) Filed: Apr. 25, 2000

Related U.S. Application Data
(60) Provisional application No. 60/147,120, filed on Aug. 4, 1999, and provisional application No. 60/147,118, filed on Aug. 4, 1999.

(51) Int. Cl.[7] .................. H01R 12/00; H01R 11/22; H01R 13/11; H05K 1/00
(52) U.S. Cl. ........................... 439/65; 439/857
(58) Field of Search .............. 439/65, 70, 73, 439/342, 857

(56) References Cited

U.S. PATENT DOCUMENTS

| | | | | |
|---|---|---|---|---|
| 4,750,891 A | * | 6/1988 | Egawa | 439/259 |
| 4,832,611 A | * | 5/1989 | Noda et al. | 439/70 |
| 4,997,385 A | * | 3/1991 | Casagrande | 439/259 |
| 5,044,973 A | * | 9/1991 | Noda et al. | 439/296 |
| 5,529,511 A | * | 6/1996 | Matsuoka | 439/342 |
| 5,616,044 A | * | 4/1997 | Tsai | 439/342 |
| 5,797,774 A | * | 8/1998 | Kaneko | 439/857 |
| 6,074,233 A | * | 6/2000 | Lin | 439/342 |
| 6,113,411 A | * | 9/2000 | Lu et al. | 439/342 |
| 6,142,811 A | * | 11/2000 | Lin | 439/342 |
| 6,165,001 A | * | 12/2000 | Hsiao | 439/342 |
| 6,171,156 B1 | * | 1/2001 | Lin et al. | 439/876 |
| 6,186,815 B1 | * | 2/2001 | Lin | 439/342 |
| 6,210,198 B1 | * | 3/2001 | McHugh et al. | 439/342 |
| 6,219,241 B1 | * | 4/2001 | Jones | 361/704 |

FOREIGN PATENT DOCUMENTS

| | | |
|---|---|---|
| WO | WO 98/15989 | 4/1998 |
| WO | WO 98/15991 | 4/1998 |

* cited by examiner

*Primary Examiner*—Tho D. Ta
*Assistant Examiner*—Edwin A. León
(74) *Attorney, Agent, or Firm*—Woodcock Washburn LLP

(57) ABSTRACT

An electrical connector includes a base and a contact and retains a generally longitudinally extending pin therein. The base has a surface and defines an aperture that extends from the surface thereinto. The aperture has a contact-receiving portion and a pin-receiving portion arranged adjacent one another along the surface. The pin is initially received in the pin-receiving portion and is then moved along a pin path generally parallel to the surface into the contact-receiving portion. A protrusion extends from the base into the aperture from a first side of the pin path in a direction generally perpendicular thereto. The contact is retained within the contact-receiving portion and has first and second beams that extend generally perpendicular to the surface of the base. The first beam has a first-contacted surface generally residing on a second side of the pin path generally opposite the first side thereof. The first-contacted surface is relatively closer to the protrusion along the pin path. The second beam has a second-contacted surface generally residing on the first side of the pin path. The second-contacted surface is relatively farther from the protrusion along the pin path. The pin is retained at a positive resting position defined by being in contact with the first beam, the second beam, and the protrusion.

19 Claims, 19 Drawing Sheets

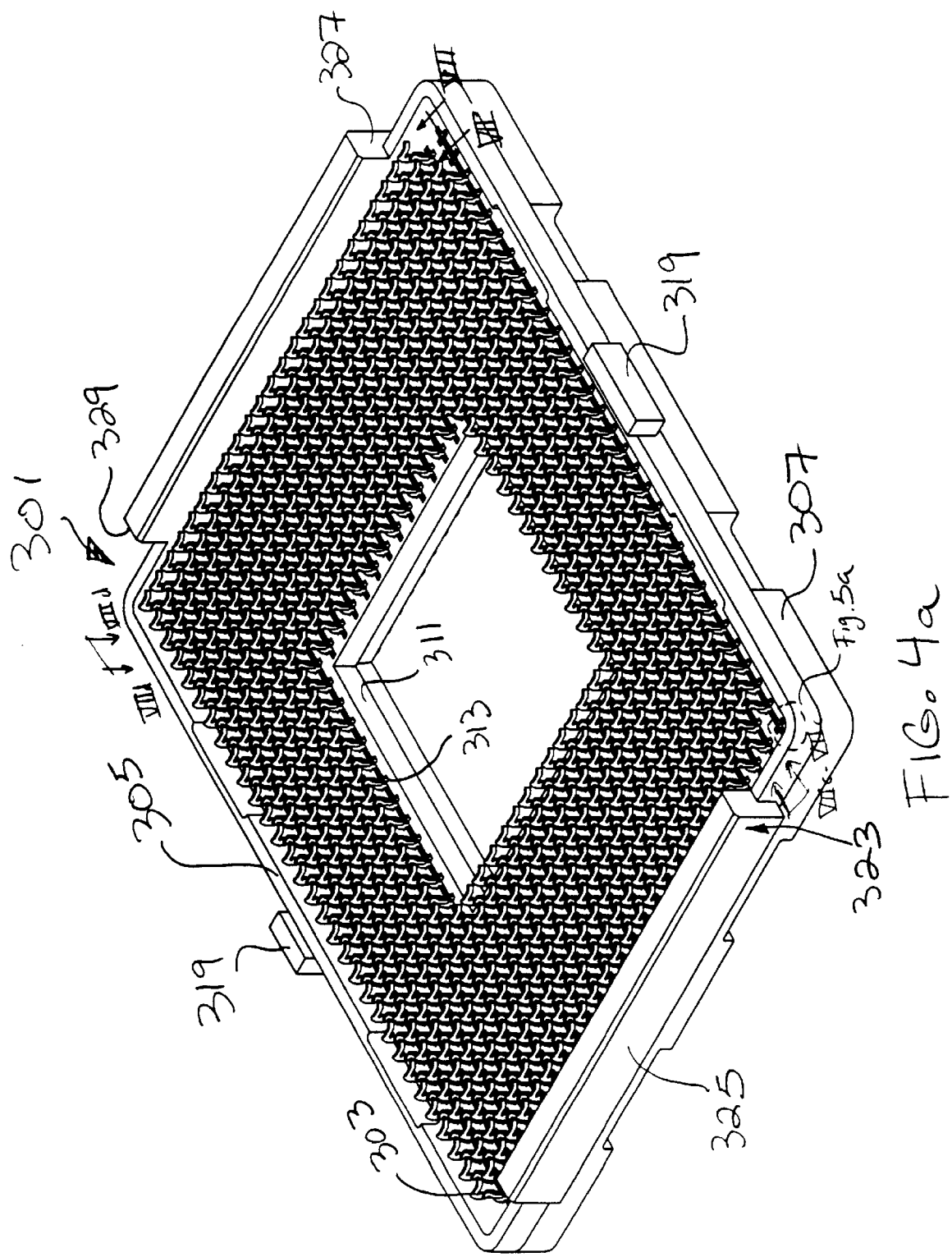

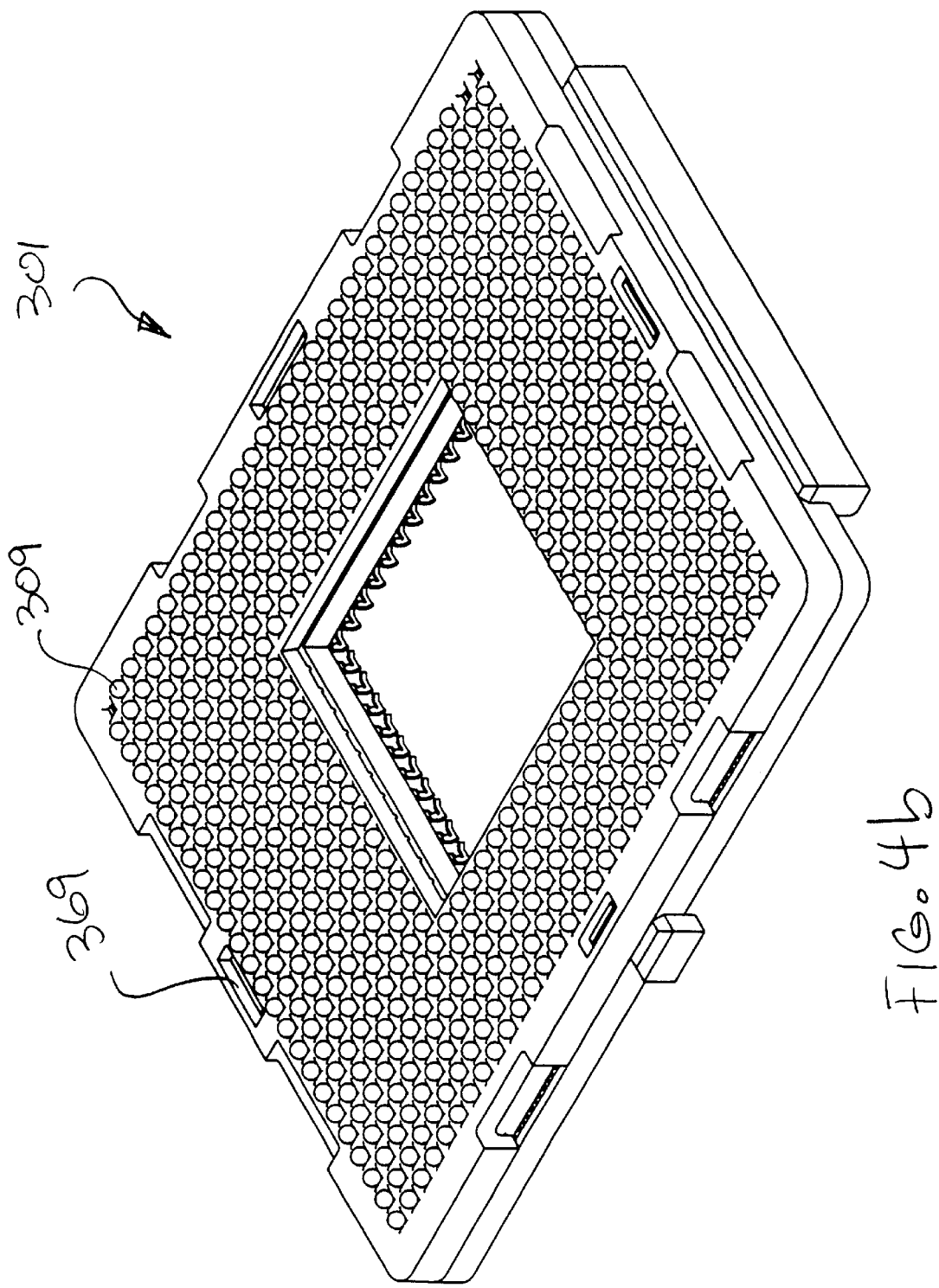

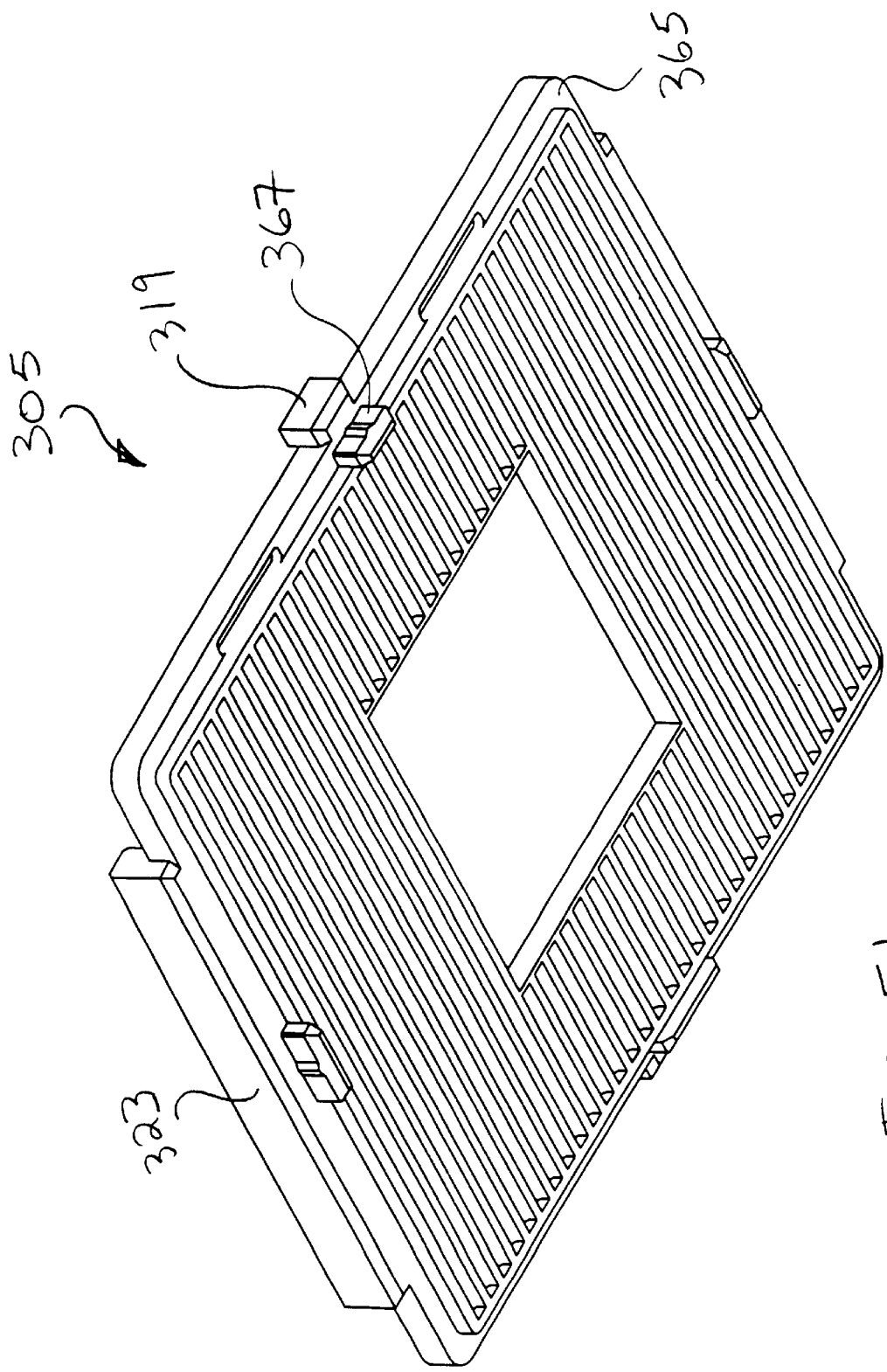

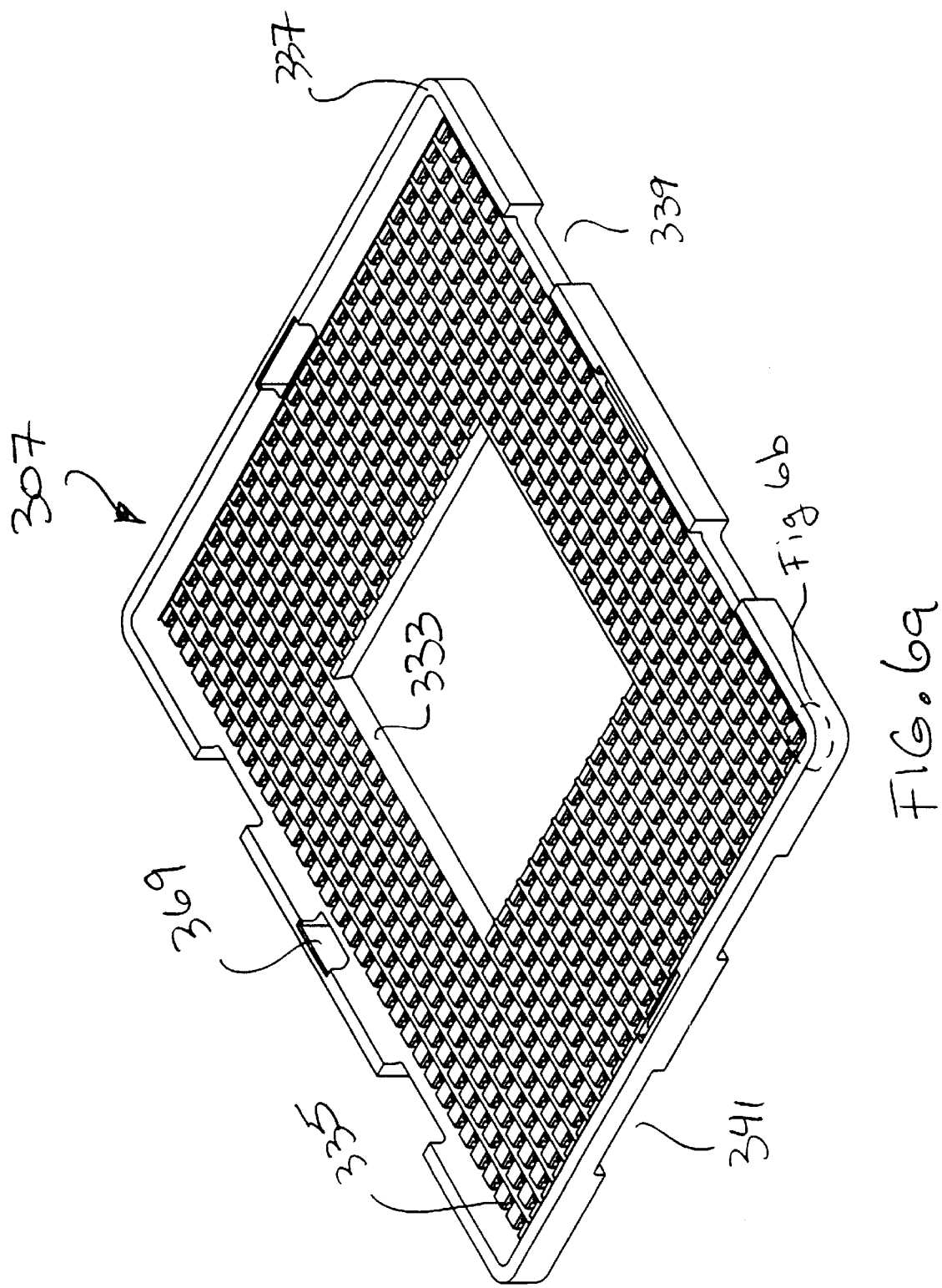

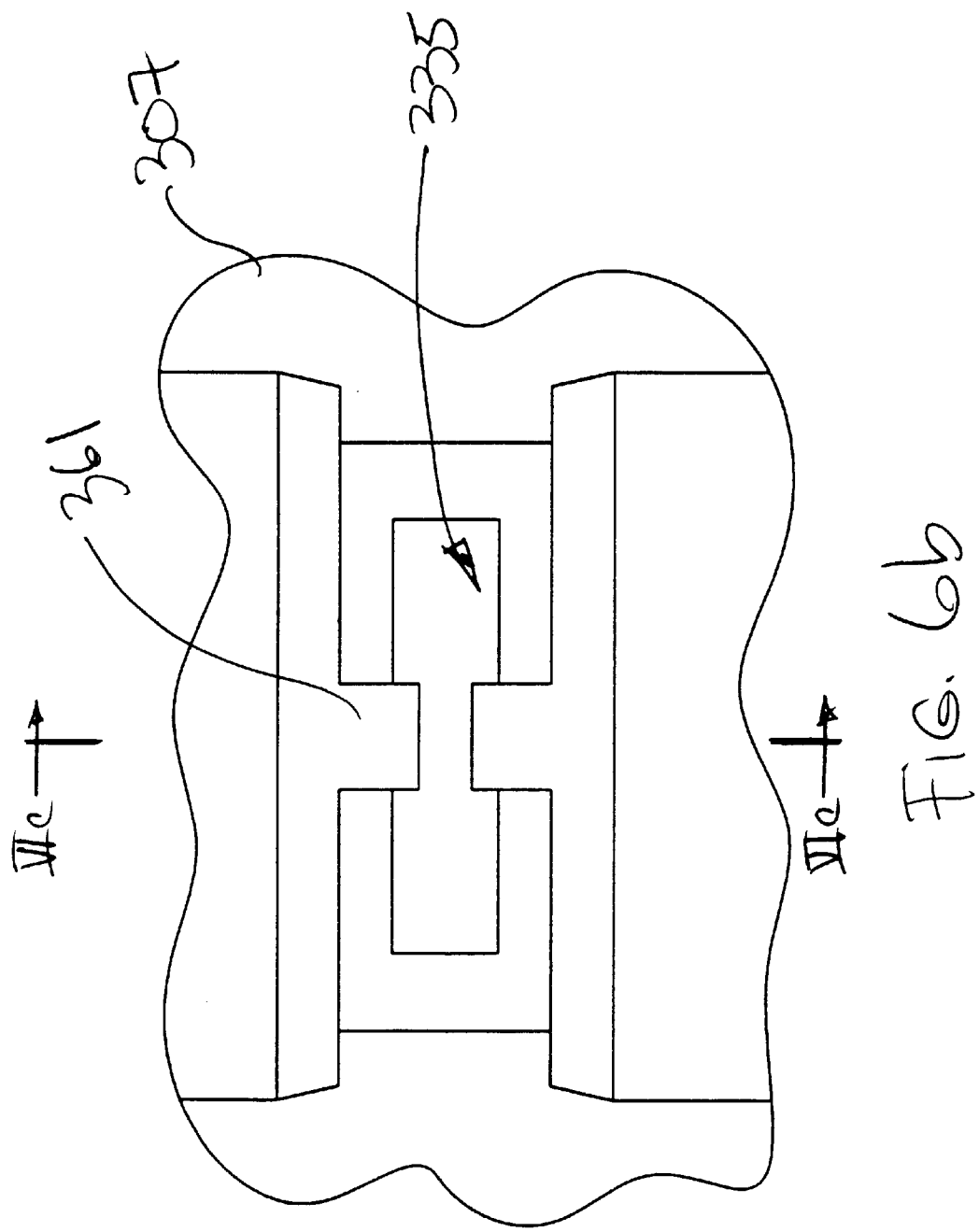

ND CONTACT
ELECTRICAL CONNECTOR AND CONTACT THEREFOR

CROSS-REFERENCE TO RELATED APPLICATIONS

This Application is related to U.S. Provisional Patent Applications Nos. 60/147,118 and 60/147,120, both filed on Aug. 4, 1999, each of which is hereby incorporated by reference.

FIELD OF THE INVENTION

The present invention relates to electrical connectors. More specifically, the present invention relates to zero insertion force (ZIF) sockets.

BACKGROUND OF THE INVENTION

A common application for ZIF sockets involves connecting a microprocessor to a circuit board. As should be understood, in one type of such socket, the microprocessor includes a plurality of pins extending away therefrom at a surface thereof, and the socket includes a corresponding plurality of pin-receiving apertures in a surface thereof. The microprocessor is initially mounted to the socket such that each pin is initially inserted into the corresponding aperture in a direction generally perpendicular to the socket surface. Thereafter, the microprocessor is urged in a direction generally parallel to the socket surface such that each pin moves in its corresponding aperture into secure contact with a contact in such corresponding aperture.

As may be appreciated, each contact may have one or more pin-contacting blades. Accordingly, achieving secure contact between each pin and each corresponding blade may require that each pin urge a corresponding blade into a spring-loaded condition. While the urging force for one pin and one set of blades may be relatively small, it is to be appreciated that present-day microprocessors can have upwards of 600–800 individual pins. Thus, the urging force for all of the pins and all of the sets of blades may become relatively large. Accordingly, a need exists for a contact design that minimizes the urging force necessary.

In prior art contact designs for the aforementioned microprocessor socket, each pin is captured between and contacts a pair of blades at generally opposing contact points on such pin. However, the potential exists that one blade in a contact will become hyper-extended and lose contact with the corresponding pin. In such a situation, the pin can lose contact with the other blade, thereby resulting in an open connection. In such prior art contact designs, each pin as captured between the pair of blades is contacted by such blades at different longitudinal points on the pin (i.e., at different elevations on the pin). As a result, the pin is subject to unevenly distributed forces which are not directly opposed and which can cause the pin to bend or break, and lose contact with the blades, again thereby resulting in an open connection.

Moreover, in a microprocessor with 600–800 individual densely packed pins, the effort necessary to detect the location of even one such open connection can be quite high, and the ability to fix such open connection may be limited. Accordingly, a need exists for a contact design that minimizes if not eliminates such open connections.

SUMMARY OF THE INVENTION

The aforementioned needs are satisfied by an electrical connector for retaining a generally longitudinally extending pin therein, where the connector includes a base and a contact. The base has a surface and defines an aperture that extends from the surface thereinto. The aperture has a contact-receiving portion and a pin-receiving portion arranged adjacent one another along the surface. The pin is initially received in the pin-receiving portion and is then moved along a pin path generally parallel to the surface into the contact-receiving portion. A protrusion extends from the base into the aperture from a first side of the pin path in a direction generally perpendicular thereto.

The contact is retained within the contact-receiving portion and has first and second beams that extend generally perpendicular to the surface of the base. The first beam has a first-contacted surface generally residing on a second side of the pin path generally opposite the first side thereof. The first-contacted surface is relatively closer to the protrusion along the pin path. The second beam has a second-contacted surface generally residing on the first side of the pin path. The second-contacted surface is relatively farther from the protrusion along the pin path. The pin is retained at a positive resting position defined by being in contact with the first beam, the second beam, and the protrusion.

BRIEF DESCRIPTION OF THE DRAWINGS

The foregoing summary, as well as the following detailed description of preferred embodiments of the present invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown. In the drawings:

FIG. 1b is a bottom perspective view of the electrical connector in FIG. 1a;

FIG. 2 is an exploded view all of the components and sub-assemblies forming the electrical connector in FIG. 1a;

FIG. 3a is a top perspective view of one sub-assembly of the electrical connector in FIG. 1a;

FIG. 3b is a bottom perspective view of the sub-assembly in FIG. 3a;

FIG. 4a is a top perspective view of another sub-assembly of the electrical connector in FIG. 1a;

FIG. 4b is a bottom perspective view of the sub-assembly in FIG. 4a;

FIG. 5a is a detailed view of the sub-assembly shown in FIG. 4a;

FIG. 5b is a bottom perspective view of one of the components in FIG. 4a;

FIG. 6a is a top perspective view of another component of the electrical connector in FIG. 1a;

FIG. 6b is a detailed view of the component in FIG. 6a;

FIG. 7a is a perspective view of one component of the electrical connector in FIG. 2a;

FIG. 7b is an opposite perspective view of the component in FIG. 7a;

FIG. 8a is a top perspective view of another sub-assembly of the electrical connector in FIG. 1a;

FIG. 8b is a bottom perspective view of the sub-assembly in FIG. 6a;

DETAILED DESCRIPTION OF PREFERRED EMBODIMENTS

Figure 1A:
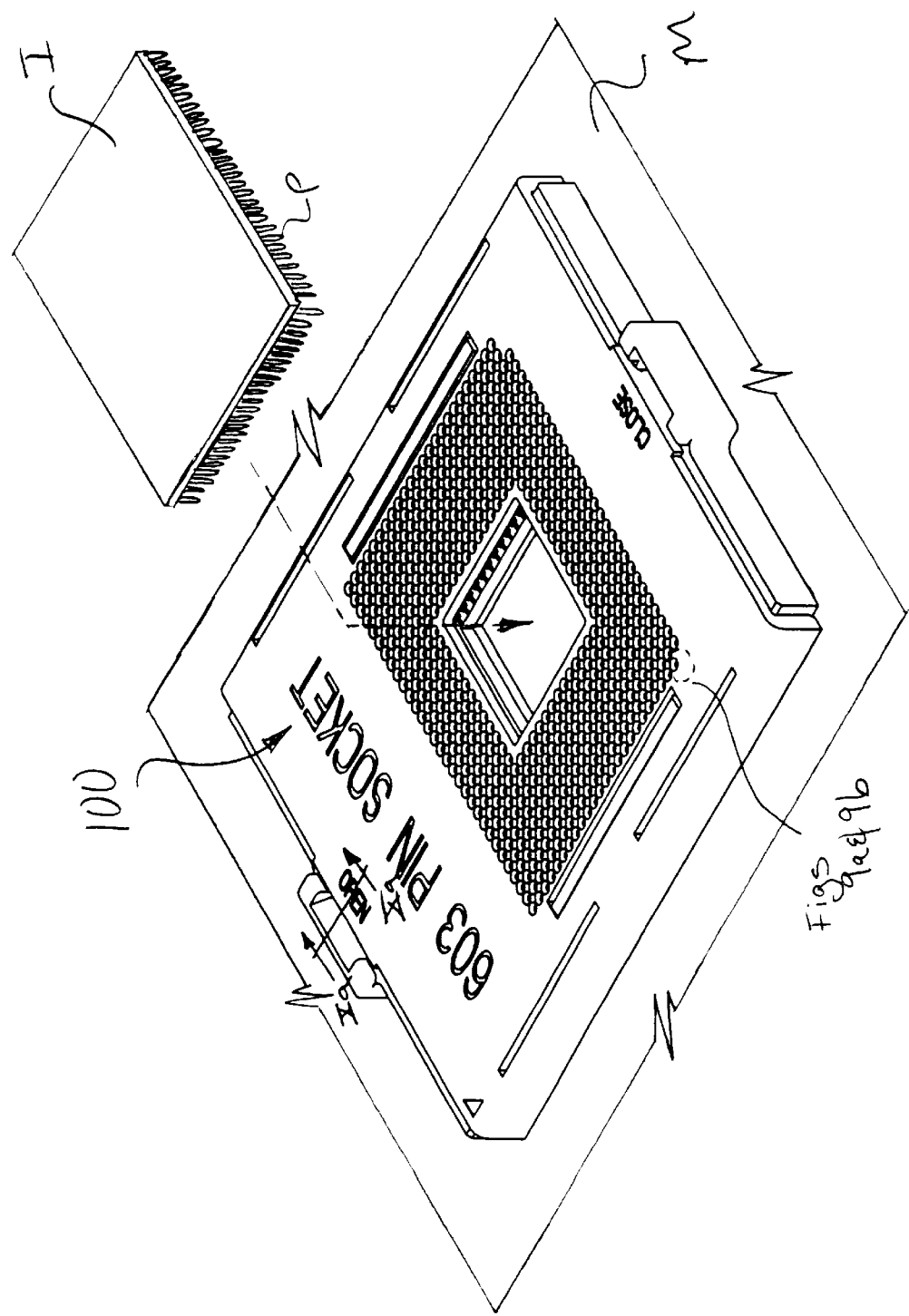
FIG. 1a is a top perspective view of one alternative embodiment of a the present invention in an assembled state.

Certain terminology may be used in the following description for convenience only and is not considered to be limiting. The words "left", "right", "upper", and "lower" designate directions in the drawings to which reference is made. The words "inwardly" and "outwardly" are further directions toward and away from, respectively, the geometric center of the referenced object. The terminology includes the words above specifically mentioned, derivatives thereof, and words of similar import.

Referring now to the drawings, wherein like numerals are used to indicate like elements throughout, there is shown among FIGS. 1–10b an electrical connector in accordance with one embodiment of the present invention. As should be understood, the electrical connector is used to connect a first electrical component to a second electrical component. More specifically, the electrical connector is a socket that connects a microprocessor interposer I having pins P disposed in an array (e.g., pin grid array (PGA)) to a motherboard M. The socket receives interposer pins P with zero (or near-zero) insertion force (ZIF), at least in the down direction. Preferably, the socket surface mounts to motherboard M, although other mounting methods could be used. Ball grid array (BGA) technology is the preferred surface mounting technique. The socket may be modular, with several sub-assemblies and sub-sub-assemblies forming the socket, although various ones of the sub-assemblies and/or sub-sub-assemblies may be combined without departing from the spirit and scope of the present invention.

Figure 1B:
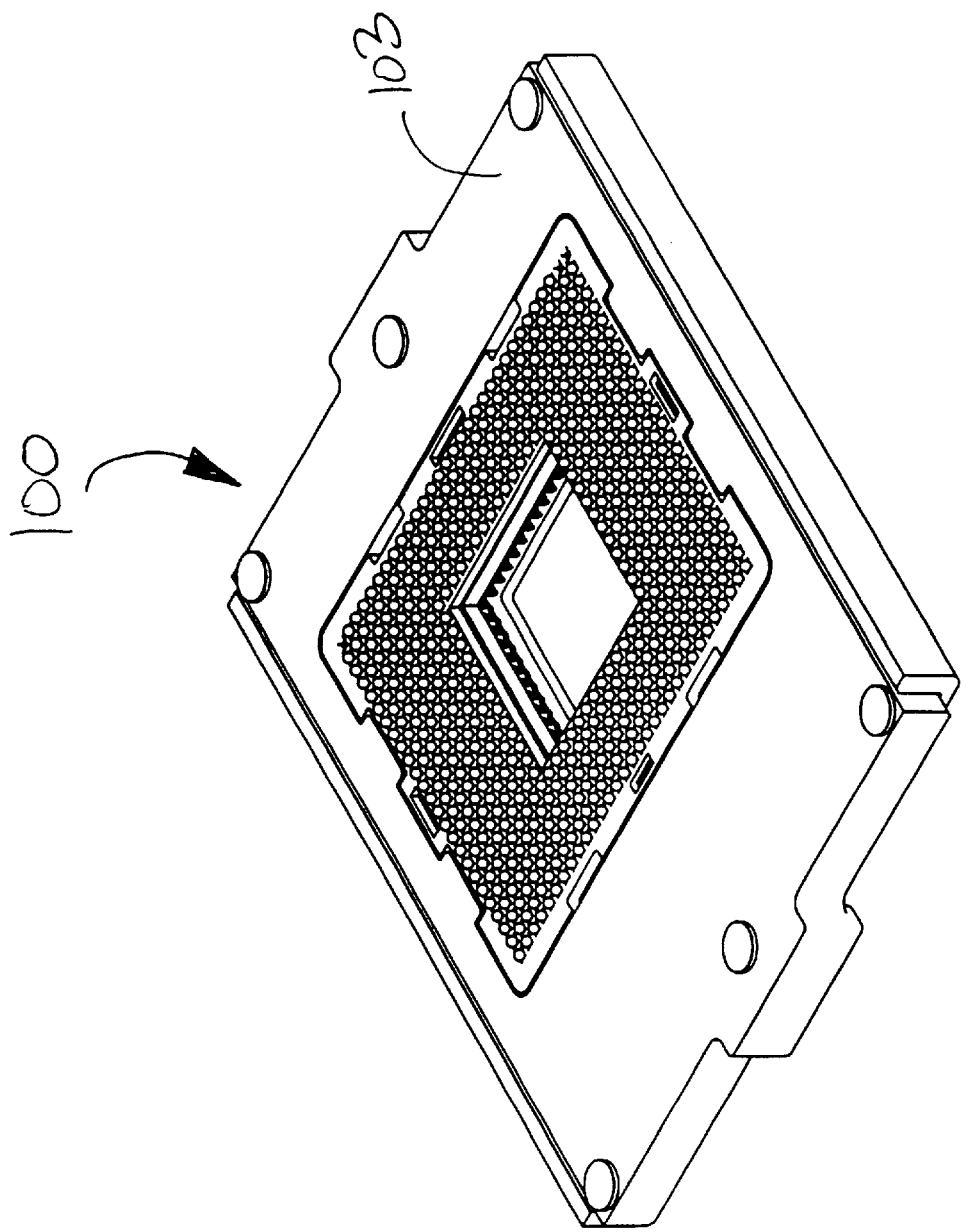

FIGS. 1a and 1b provide a top and a bottom perspective view, respectively, of a socket 100. A top 101 of socket 100 faces, and receives, interposer I. A bottom 103 of socket 100 faces, and mounts to, motherboard M. Although the various drawings demonstrate socket 100 as being actuated by a hand tool T, such as a screwdriver, other actuation mechanisms (e.g. a lever rotating an eccentric cam) could be used.

Figure 2:
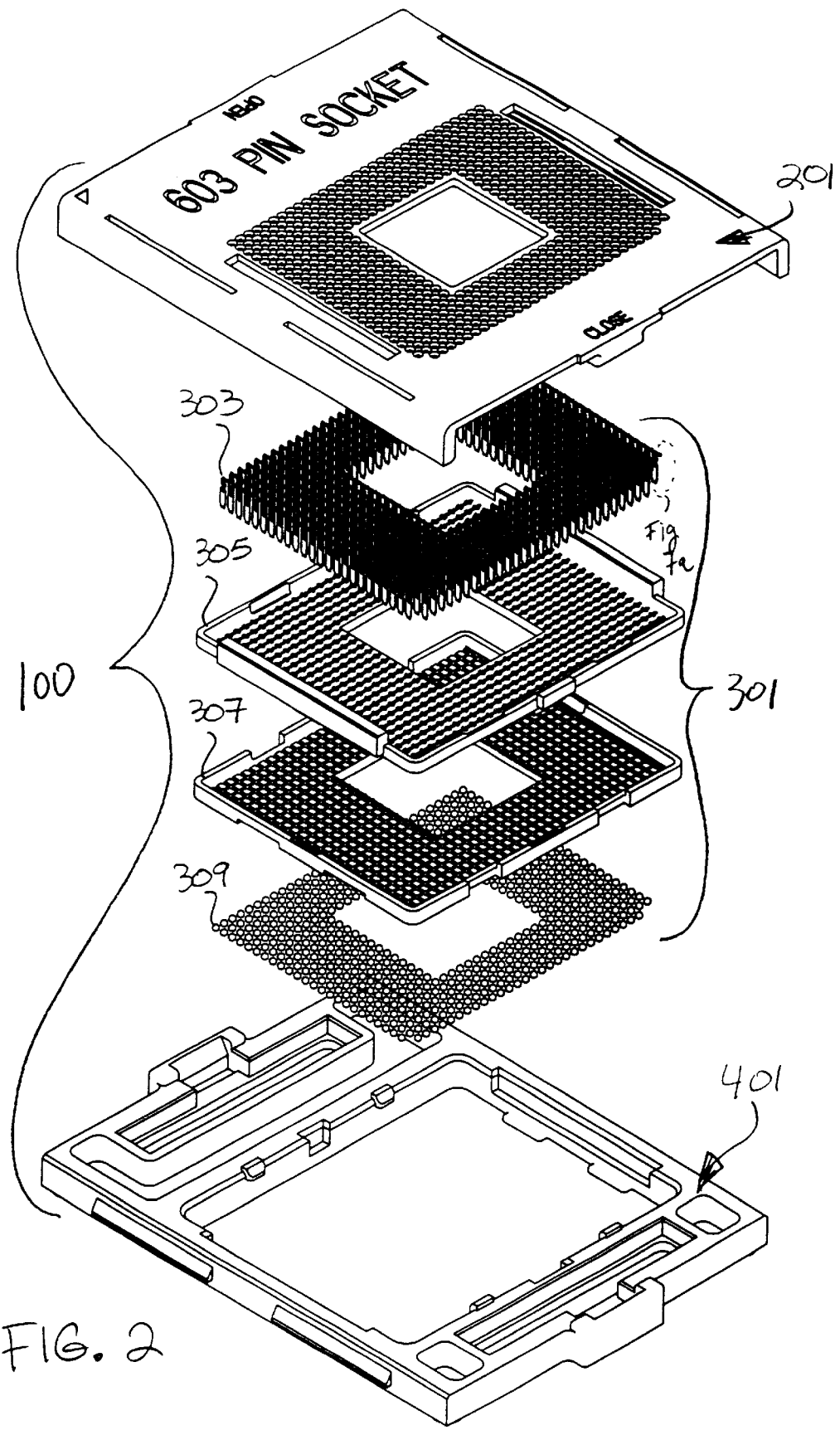

As seen in FIG. 2, numerous components form socket 100. Socket 100 could include, for example, a cover 201, a plurality of contacts 303, a spacer 305, a contact housing 307, a plurality of solder masses 309 and a base frame 401. Contacts 303, housing 305, contact housing 307 and solder masses 309, when assembled together, form contact housing sub-assembly 301. If surface mounting of socket 100 is not required or if a different type of surface mount technique is used, solder masses 309 may not be required. As described in more detail below, assembly of socket 100 involves placing contact housing sub-assembly 301 into base frame 401, then securing cover 201 over base frame 401.

FIGS. 4a and 4b display a macro-view of the assembled contact housing sub-assembly 301, including the aforementioned contacts 303, spacer 305, contact housing 307 and solder masses 309. FIGS. 4a, 5a, 5b and 5c in particular display spacer 305, which is preferably used to increase the mating height of socket 100. Note that for the sake of clarity, FIGS. 4a, 4b, 5a, and 5b omit many of the features shown and discussed in connection with FIGS. 5c, 6c, 7a–7f, 9a and 9b (for example, the details of the contacts 303, the protrusions 909).

Figure 5A:
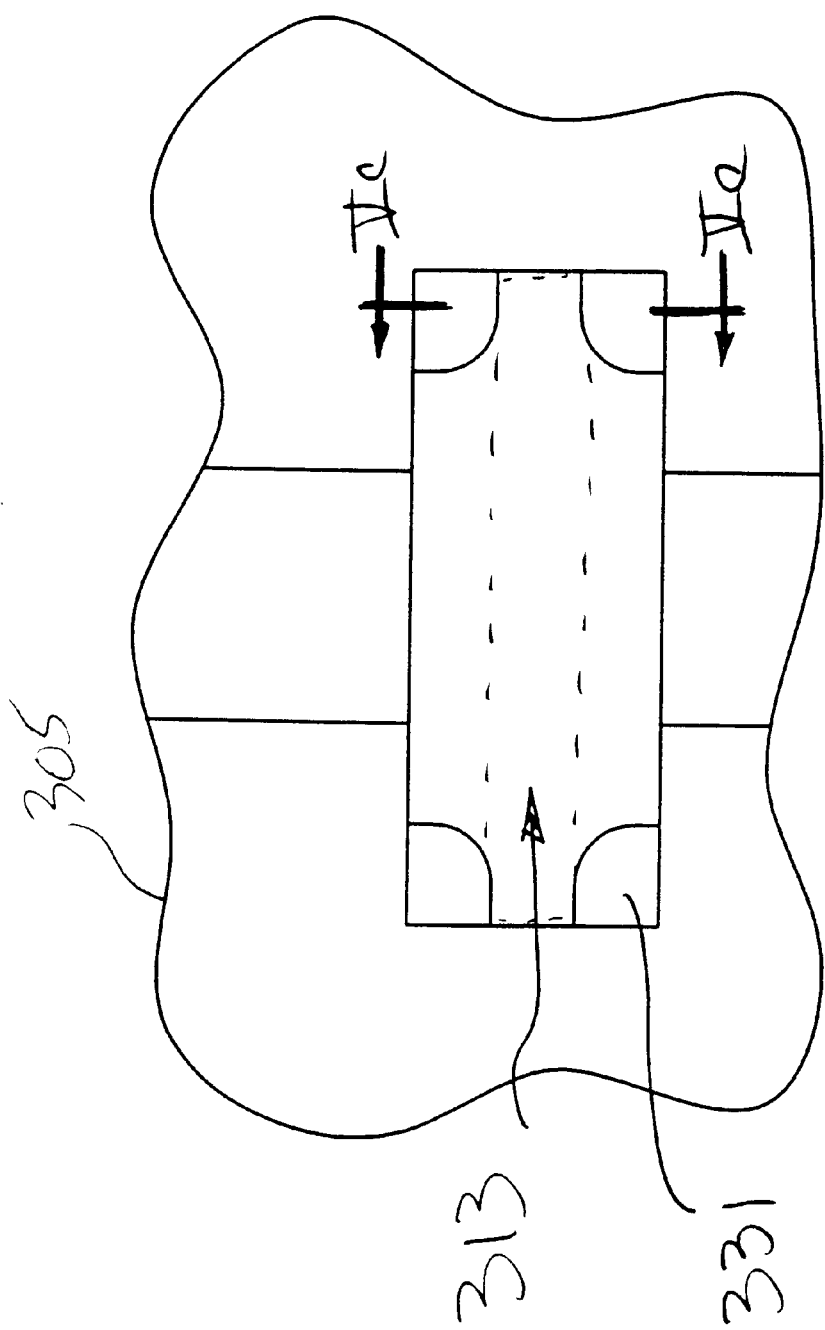
Figure 5C:
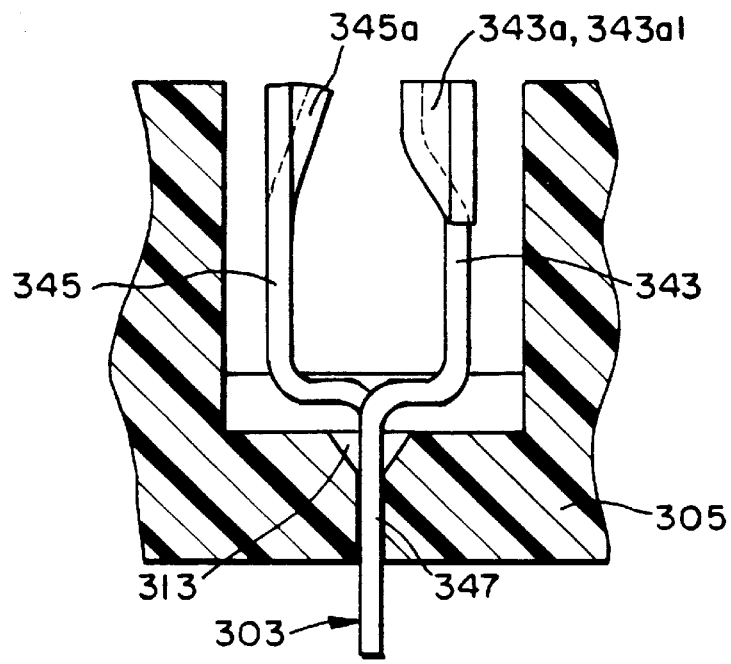
FIG. 5c is a cross-sectional view of the component in FIG. 5a taken along lines Vc—Vc.

Spacer 305, preferably made from a suitable insulative material such as a high temperature thermoplastic, has a planar base 311 with an array of apertures 313 therethrough. A peripheral wall 315 extends around, and upwardly from, base 311. A peripheral recess 365 extends around base 311. Each aperture 313 frictionally retains a corresponding contact 303 therein. As shown in FIGS. 5a and 5c, aperture 313 preferably has an appropriately tapered lead-in surface. The lead-in aids in the insertion of contacts 303 into spacer 305 and allows the arms of contact 303 to flex during insertion of interposer pin P.

In one embodiment of the present invention, and as seen in FIG. 5a, spacer 305 helps retain and stabilize contacts 303 using deformable ribs 331. Located at the four corners of aperture 313, ribs 331 deform upon insertion of contact 303, but have sufficient rigidity to prevent rotation of contact 303 during mating with interposer pin P. Other types of ribs and/or other contact stabilizers may be employed without departing from the spirit and scope of the present invention.

While providing some rigidity to spacer 305, the geometry of and various features on wall 315 also allow spacer 305 to flex. For instance, the inner surface of wall 315 includes channels 317 that correspond to the locations of cutout sections on the outer wall of contact housing 307. Channels 317 provide a reduced thickness section to wall 315. This allows wall 315 to resile during insertion of contact housing sub-assembly 101 into base frame 401, which is described in more detail below. As discussed earlier, a flexible spacer 305 is desired so that spacer 305, rather than solder masses 309, absorb stresses resulting from CTE (coefficient of thermal expansion) mismatch or from interposer pins P mating with contacts 303.

On opposed sides of spacer 305, the outer surface of wall 315 includes blocks 319. Blocks 319 extend past wall 315 as shown in FIG. 4a and reside within notches in base frame 401 and can act as keying features. That is, blocks 319 can have different sizes in order to prevent incorrect placement of contact housing sub-assembly in base plate 401. As such, contact housing sub-assembly 301 mounts on base plate 401 only when blocks 319 align with correspondingly sized notches on base frame 401. The other opposed sides of wall 315 include splines 323. Similar to blocks 319, 321, splines 323 extend past wall 315 and reside within keyways 221 when cover 201 snap fits onto base frame 401. Splines include a guidance surface 325 flanked by opposed stop surfaces 327, 329.

In the closed position, stop surfaces 225, 327 abut. In the open position, stop surfaces 227, 329 abut. During actuation of socket 100 between the open and closed positions, guidance surface 223 of cover 201 travels along guidance surface 325 of contact housing sub-assembly 301. This arrangement provides direct alignment between cover 201 (containing interposer pins P) and contact housing sub-assembly 301 (containing contacts 303). In other words, the manufacturing tolerances of base frame 401 do not affect the ability of interposer pins P and contacts 303 to align properly. In addition, splines 323 also reside in notches 415 in base frame 401. Since splines 323 are not interference fitted into notches 415, no stress accumulation occurs. However, the splines are suitably sized relative to notches 415 in order to provide guidance.

Beneath blocks 319 and splines 321, posts 367 extend past the lower surface of base 311 of spacer 305. During the build up of contact housing sub-assembly 301, posts 367 enter corresponding openings in the contact housing 307.

Spacer 305 could be injection molded using a liquid crystal polymer (flexibility of housing 305, additional flexibility may be required. Flexibility could be increased by adjusting the relative dimensions of housing 305. For example, base 311 could have a thickness of 1.28 mm and peripheral wall 315 could have a height of 0.95 mm and a thickness of 0.75 mm.

Figure 6C:
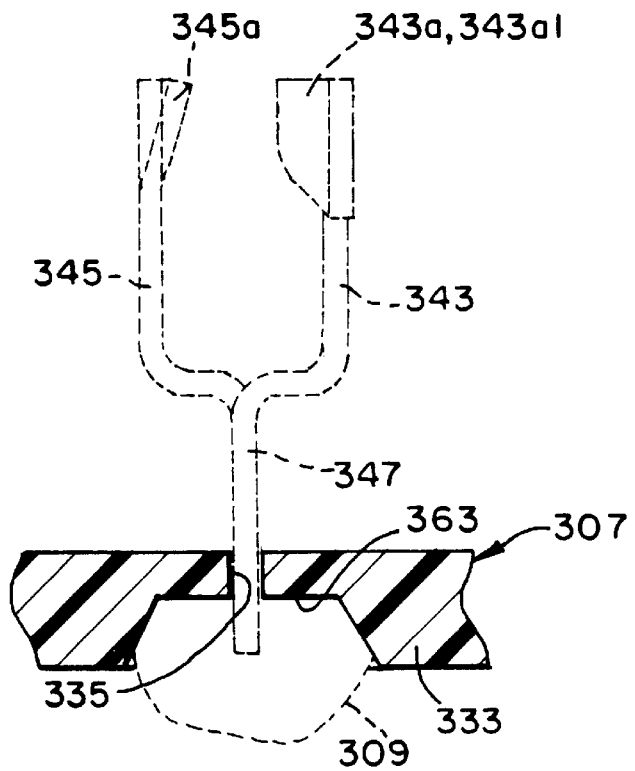
FIG. 6c is a cross-sectional view of the component in FIG. 6b taken along lines VIb—VIb.

FIGS. 4b, 6a, 6b and 6c display contact housing 307. Note here too that for the sake of clarity, FIGS. 4b, 6a, and 6b omit many of the features shown and discussed in connection with FIGS. 5c, 6c, 7a–7f, 9a and 9b. Similar to spacer 305, contact housing 307 is made from a suitable insulative material such as a high temperature thermoplastic and includes a planar base 333 with an array of apertures 335 therethrough. A peripheral wall 337 extends around base 333. Each aperture 335 frictionally retains a corresponding contact 303 therein. As shown in FIG. 6b, aperture 335 preferably has a tapered lead-in surface. The lead-in aids in the insertion of contacts 303 into contact housing 307 and acts as a stop for shoulders 359 on the contact 303 (as will be discussed below in connection with FIGS. 7a and 7b). Once shoulders 359 engages the lead-in portion of aperture 335, contact 303 cannot extend further into aperture 335. Deformable ribs 361 in aperture 335 help contact housing 307 retain contacts 303. Such ribs 361 are centrally located on opposite side walls of aperture 335. Aperture 335 should also have a recess 363 at a mounting end. Recess 363 allows a portion of solder mass 309 to reside therein.

The outer surface of peripheral wall 337 includes various features that interact with corresponding features on base frame 401 to retain contact housing subassembly 301 in base frame 401. Opposite sides of peripheral wall 337 include cut-out sections 339. Cut-out sections 339 allow contact housing 307 to pass freely by latch structure on base frame 401 during placement of contact housing sub-assembly 301 into base frame 401. The other opposite sides of peripheral wall 337 include notches 341. When inserting contact housing 307 into base frame 401, notches 341 rest on an upper surface of a ledge projects inwardly from a wall defining a central opening. Each side of the inner surface of peripheral wall 337, along with a corresponding portion of base 333, includes an opening 369. Openings 369 receive posts 367 on spacer 305.

Contact housing 307 could be injection molded using a liquid crystal polymer (LCP). While the apertures help increase the flexibility of contact housing 307, additional flexibility may be required. As with spacer 305, the flexibility could be increased by adjusting the relative dimensions of contact housing 307. For example, base 333 could have a thickness of 1.02 mm and peripheral wall 337 could have a height of 0.78 mm and a thickness of 0.75 mm.

Figure 7A:
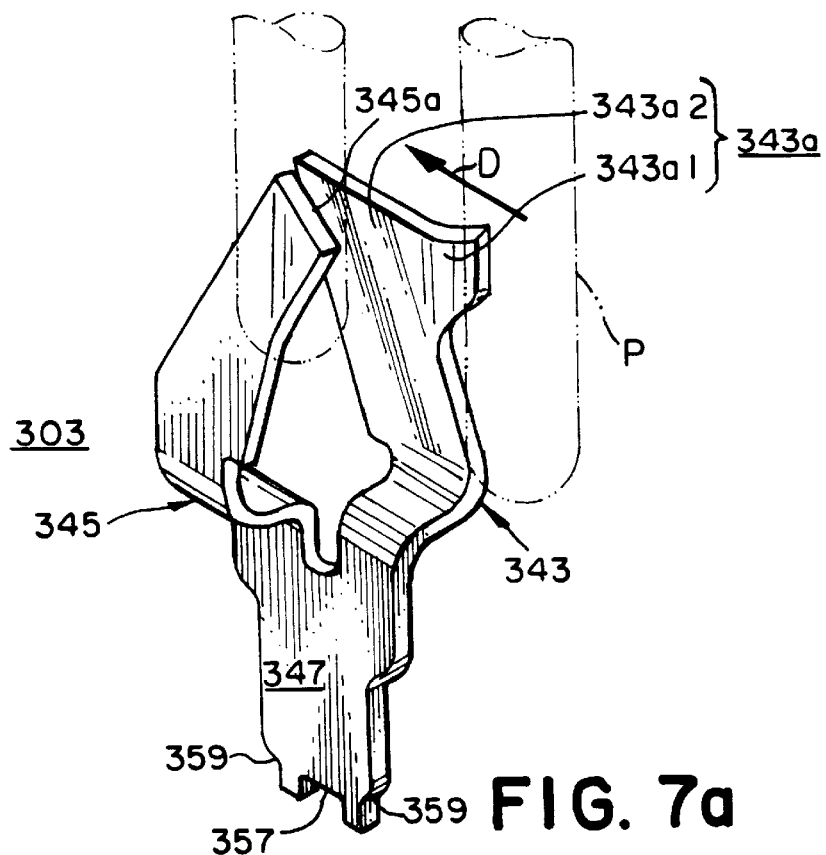
Figure 7B:
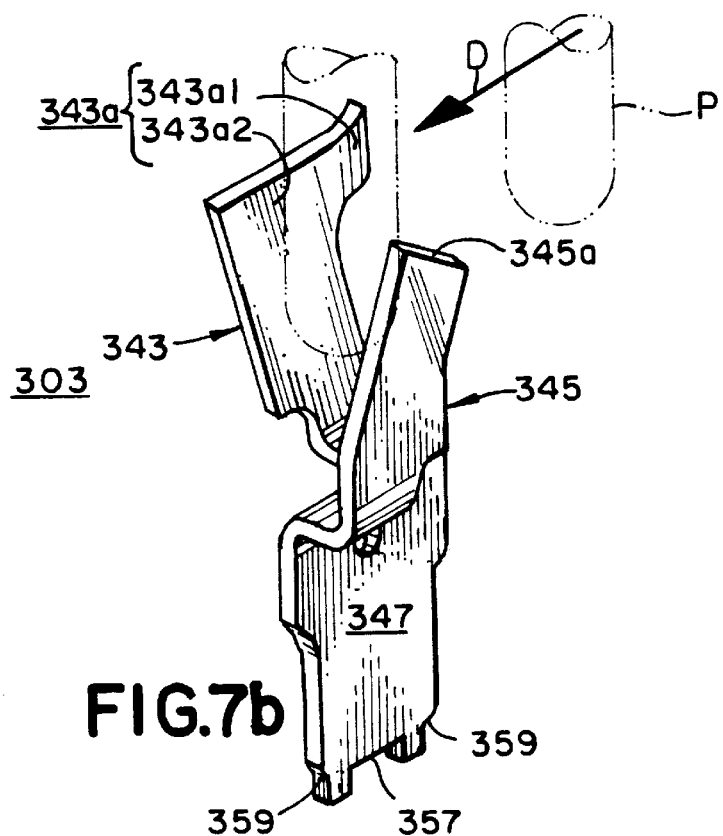

FIGS. 7a and 7b display a contact 303 constructed in accordance with one embodiment of the present invention. As may be appreciated, multiple ones of such contact 303 are deployed in the socket, each contact 303 corresponding to a respective pin P in the interposer I. Each contact 303 may be stamped and formed from a carrier strip of conductive material such as a copper alloy, or may be molded in its final form, for example. Generally, any method of formation of the contact 303 and any conductive construction material may be employed without departing from the spirit and scope of the present invention. As seen, the contact 303 has first and second beams 343, 345 extending from one end of a base section 347. The opposite end of base section 347 includes a mounting section 357 flanked by shoulders 359. The length of the base section 347 may vary depending on the thickness of the spacer 305 and contact housing 307. Moreover, the contact 303 may be employed in a socket where the spacer 305 and contact housing 307 are combined into a substantially unitary body (not shown).

Figure 7C:
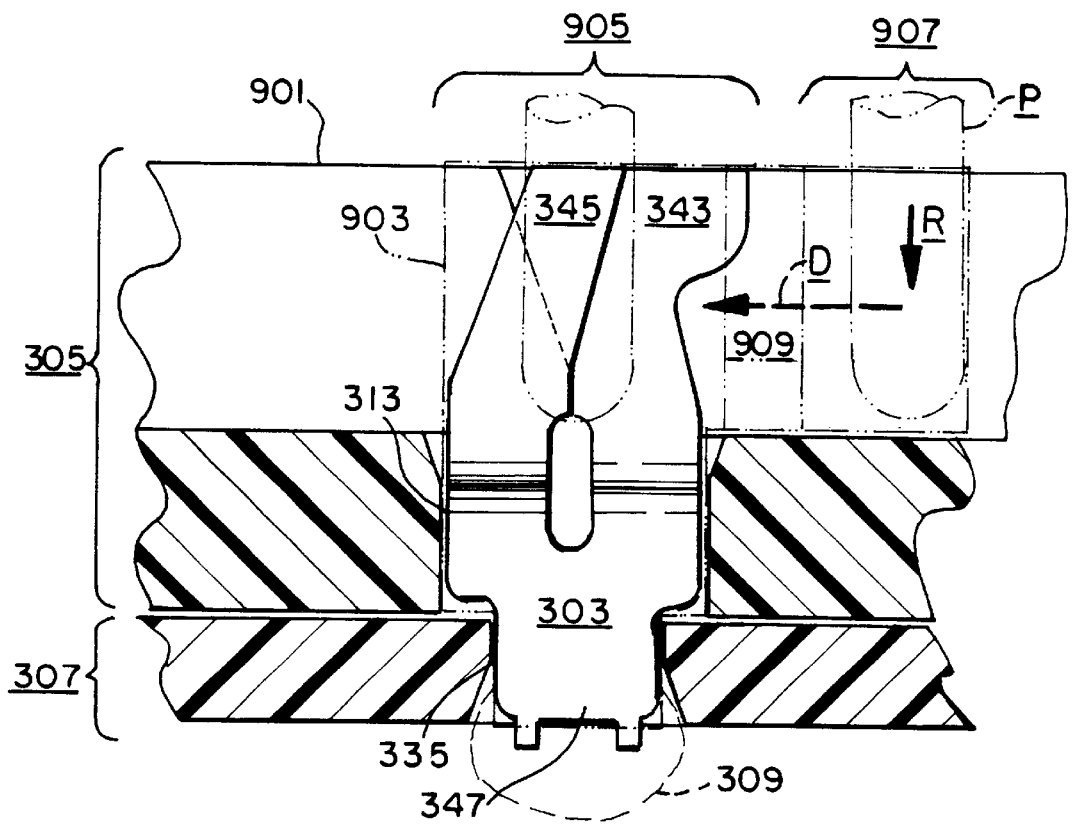
FIG. 7c is a cross-sectional view of the sub-assembly in FIG. 4a *taken along lines VIIc—VIIc;*

For purposes of describing the contact 303 and the use thereof, it is to be understood that each such contact 303 is inserted into the socket within a base formed by the combination of spacer 305 and contact housing 307. As seen in FIG. 7c, such base 305/307 has a surface 901 generally at the top thereof, where such surface generally faces toward the cover 201 (not shown in FIG. 7c). For each contact 303, the base 305/307 defines an aperture 903 that extends from the surface 901 down and thereinto. As should be appreciated, such aperture 903 includes: (1) the aperture 313 in the spacer 305; (2) the aperture 335 directly below and in the contact housing 307 and (3) an area directly above within which the beams 343, 345 reside. Thus, such items (1)–(3) in combination form a contact-receiving portion 905 for receiving a contact 303.

Such aperture 903 additionally includes a pin-receiving portion 907 for receiving a pin P that corresponds to the contact 303 in the contact-receiving portion 905 of such aperture 903. As seen in FIG. 7c, the pin-receiving portion 907 is arranged adjacent the contact-receiving portion 905 along the surface 901 such that the pin-receiving portion 907 of the aperture 903 'flows' into the corresponding contact-receiving portion 905. As also seen, such pin-receiving portion 907 extends into the base 305/307 about the same depth as item (3) of the contact-receiving portion 905. Put another way, the contact-receiving portion 905 has a lower section relatively farther from the surface (i.e., items (1) and (2) in the lower part of the spacer 305 and the contact housing 307) and an upper section relatively closer to the surface (i.e., item (3) in the upper part of the spacer 305). Correspondingly, the pin-receiving portion 907 is relatively closer to the surface 901 and is in communication with the upper section of the contact-receiving portion 905 (i.e. is height-coexistent with item (3) in the upper part of the spacer 305).

As may now be understood, a corresponding pin P from the interposer I (FIG. 1) which is generally round in cross-section is initially received in each aperture 903 in the pin-receiving portion 907 thereof in a direction generally perpendicular to the base 305/307 and the surface 901 thereof (arrow R in FIG. 7c), and is then moved along a pin path D generally parallel to the surface 901 and into the upper-section of the contact-receiving portion 905. In one embodiment of the present invention, the pin path is generally linear, although as 30 seen in FIGS. 7d–7f, the base 305/307 includes a protrusion 909 that extends into the aperture 903 from a first side of the pin path D in a direction generally perpendicular thereto. As should be appreciated from FIGS. 7d–7f, the protrusion 909 generally defines a boundary between the contact-receiving portion 905 and the pin-receiving portion 907, at least in the region of the base 305/307 through which the pin P travels along the pin path D. Protrusion 909 may be molded along with the spacer 305 of the base 305/307, although other arrangements may be employed without departing from the spirit and scope of the present invention. For example, the protrusion 909 may be formed as a separate piece (not shown) that is inserted into position in the spacer 305.

As will be explained in more detail below, the protrusion 909 is large enough to slightly block the pin P as it travels along the generally linear pin path D. Accordingly, the pin P upon moving along the pin path P encounters such protrusion 909 and then resiliently deforms away from the protrusion 909 and away from the first side of the pin path D and toward a second, opposing side of such pin path D. Alternatively, protrusion 909 could resile, sufficient clearance between pin P and opening 209 could allow pin P to move, and/or the entire connector could have enough tolerance to allow pin P to move. Thus, the pin P skirts around such protrusion as such pin P enters the contact-receiving portion 905 of the aperture 903 within which the corresponding contact 303 resides.

Figure 7D:
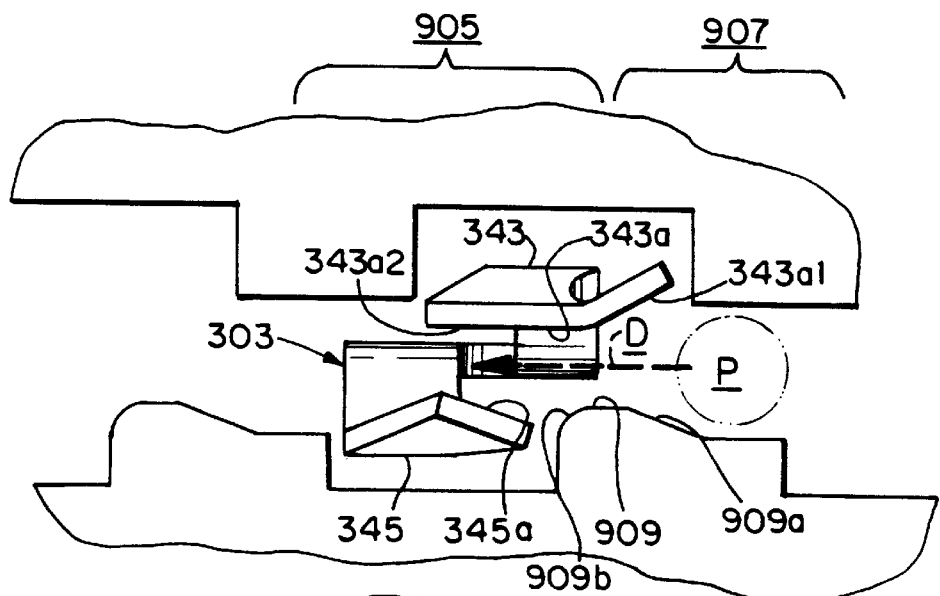
FIGS. 7d–7f are cross-sectional views of the sub-assembly in FIG. 4a taken along lines VIId—VIId and show a pin during various stages of coupling to a respective contact.
Figure 7E:
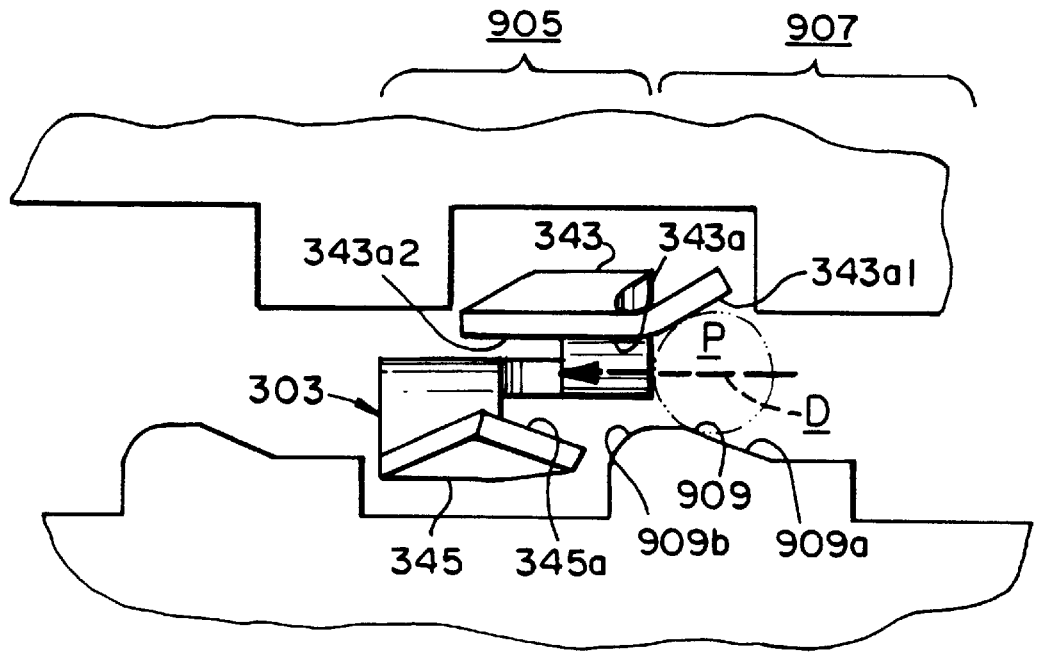
Figure 7F:
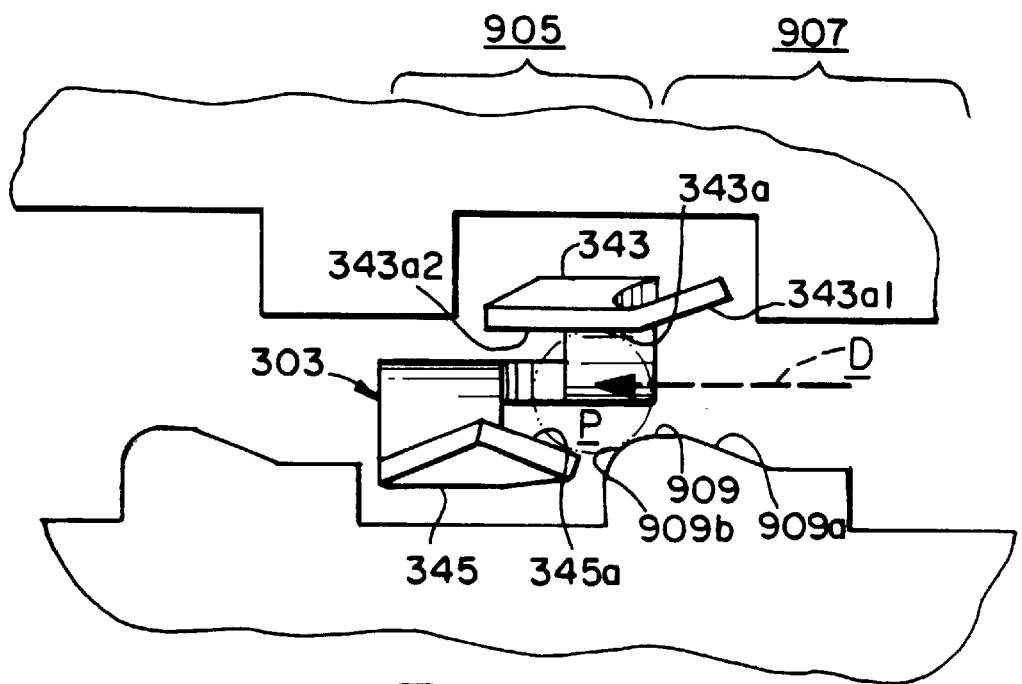
Figure 6A:
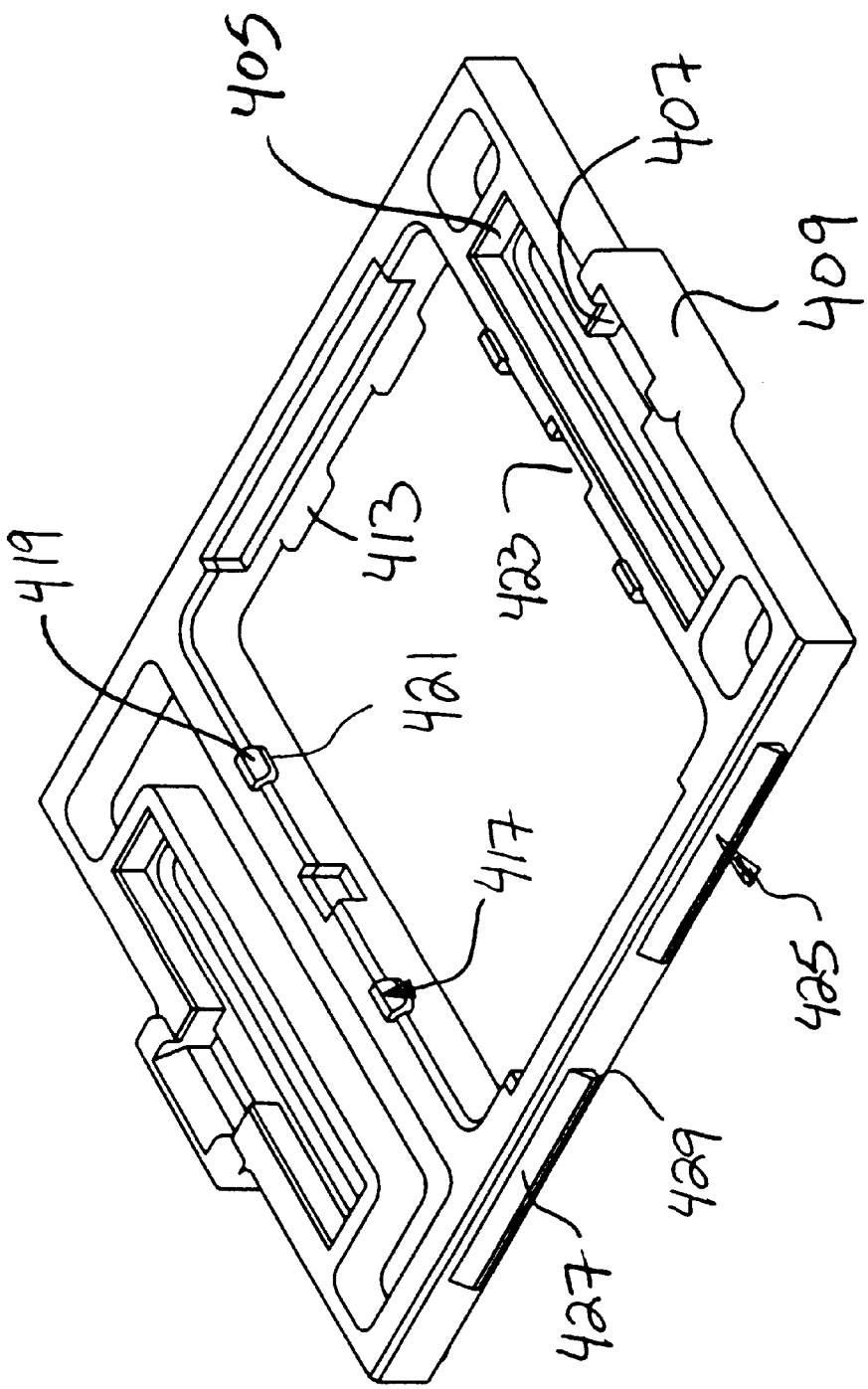
Figure 86:
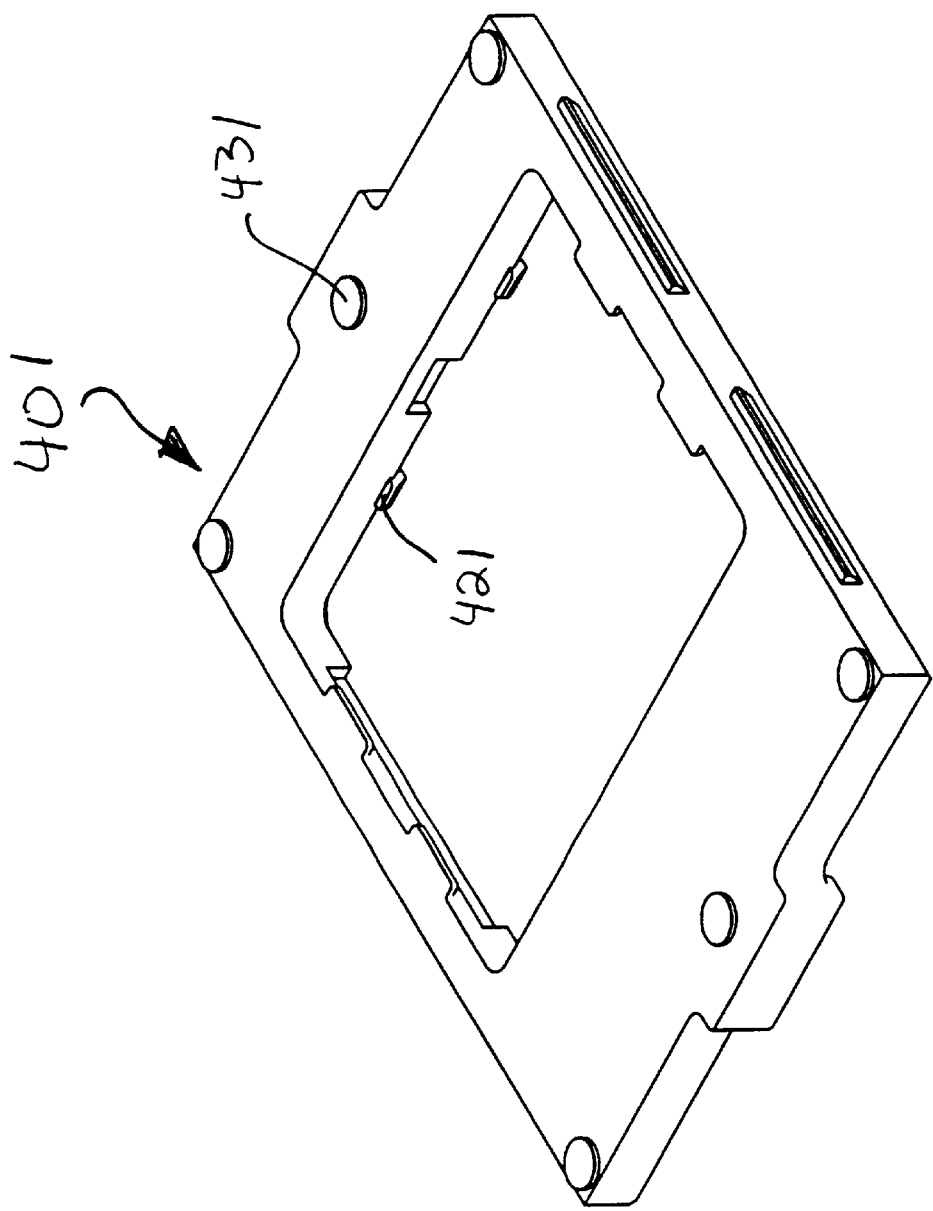

In one embodiment of the present invention, the contact 303 as shown in FIGS. 7a–7f is retained within the base 305/307 in the contact-receiving portion 905 of the aperture 903 such that the main body 347 thereof is frictionally retained within the lower section of the contact-receiving portion 905, and such that the first and second beams 343, 345 extend from the main body 347 generally perpendicularly into the upper section of the contact-receiving portion 905 and toward the surface 901 of such base 305/307. The first beam 343 of the contact 303 has a first-contacted surface 343a, and the second beam 345 of such contact 303 has a second-contacted surface 345a. As best seen in FIGS. 7d–7f, the first beam 343 and its first-contacted surface 343a generally reside on the second side of the pin path D and therefore across such pin path D from the protrusion 909. Correspondingly, the second beam 345 and its second-contacted surface 345a generally reside on the first side of the pin path D and therefore adjacent and on the same side of the pin path D as the protrusion 909.

Moreover, the first-contacted surface 343a is relatively closer to the protrusion 909 along the pin path D, and the second-contacted surface 345a is relatively farther from the protrusion 909 along the pin path D. Accordingly, and as seen from FIGS. 7d–7f, upon moving along the pin path D from the pin-receiving section 907 to the contact-receiving section 905, the pin P may initially contact the protrusion 909, then (or simultaneously with the contacting of the protrusion 909) contact the first-contacted surface 343a of the first beam 343. Upon continued movement, pin P then contacts the second-contacted surface 345a of the second beam 345, and comes to rest at a positive resting position, as will be discussed in more detail below.

Importantly, by serially contacting the first beam 343 and then the second beam 345, the peak insertion force necessary for moving the pin P along the pin path D is believed to be reduced. That is, less force is believed to be required to resiliently deform the first beam 343 and then the second beam 345 as compared to resiliently deforming both the first and second beams 343, 345 simultaneously. The reduction in peak insertion force becomes more pronounced with larger numbers of pins P in the connector.

In the aforementioned positive resting position, the pin P is retained in the contact-receiving section 905 in contact with the first-contacted surface 343a of the first beam 343, the second-contacted surface 345a of the second beam 345, and the protrusion 909. As should be appreciated, the three-point contact in such positive resting position ensures that the pin P is properly received, and also ensures that the pin P will not inadvertently slip out from contacting the contact 303.

In one embodiment of the present invention, and as best shown in FIGS. 7d–7f, the first-contacted surface 343a of the first beam 343 has a first portion 343a1 generally at an angle to the pin path D, as a lead-in surface, and a second portion 343a2 generally parallel to the pin path D. Being such a lead-in surface, surface 343a1 is relatively closer to the protrusion 909 along such pin path D as compared to surface 343a2. Surface 343a2 thus is relatively farther from the protrusion 909 along such pin path D. Accordingly, the pin P moving along the pin path D first contacts the first, angled portion 343a1 of the first-contacted surface 343a, then contacts the second, parallel portion 343a2 of such first-contacted surface 343a. Moreover, in such embodiment, the second-contacted surface 345a of the second beam 345 is generally at an angle to the pin path D. As should be appreciated, by being angled, the first portion 343a1 and the second-contacted surface 345a present a relatively broad face for initial contact with the pin P, and the likelihood that pin P will 'slide off' the respective beam 343, 345 is thereby reduced if not eliminated.

Thus, the pin P as moving along the pin path D from the pin-receiving portion 907 toward the contact-receiving portion 905 initially contacts the protrusion 909, then contacts the first portion 343a1 of the first-contacted surface 343a of the first beam 343, then contacts the second portion 343a2 of the first-contacted surface 343a of the first beam 343, then contacts the second-contacted surface 345a of the second beam 345, and then comes to rest at the positive resting position. In such embodiment, then, such positive resting position is defined by the pin P being in contact with the second portion 343a2 of the first-contacted surface 343a of the first beam 343, the second-contacted surface 345a of the second beam 345, and the protrusion 909. Accordingly, and as seen in FIGS. 7d–7f, each point of contact with the generally round pin P is with a surface that is generally tangential to such pin P.

In one embodiment of the present invention, and still referring to FIGS. 7d–7f, the protrusion 909 has an initially-contacted surface 909a facing generally toward the pin-receiving portion 907, and a resting-contacted surface 909b facing generally toward the contact-receiving portion 905. As should be appreciated surfaces 909a and 909b flank the crown of the protrusion 909 (i.e., the region on the surface of the protrusion 909 that most extends toward the pin path D). Thus, when the pin P moves along the pin path D from the pin-receiving portion 907 toward the contact-receiving portion 905, such pin P initially contacts the initially-contacted surface 909a of the protrusion 909, reaches a peak deflection at the crown of the protrusion 909, and then comes to rest at a positive resting position defined by being in contact with the first-contacted surface 343a of the first beam 343, the second-contacted surface 345a of the second beam 345, and the resting-contacted surface 909b of the protrusion.

In one embodiment of the present invention, the pin P at the positive resting position is contacted by each of the first beam 343, the second beam 345, and the protrusion 909 at approximately a common longitudinal height or elevation thereon, as may best be seen in FIG. 7c. Accordingly, the pin P is subject to approximately equally distributed forces which are properly opposed. As a result, the likelihood that such pin P will bend or break based on un-opposed forces and thereby lose contact with the first and second beams 343, 345 is minimized if not eliminated.

A mounting section 357 extends from an opposite end of base section 347. Preferably, mounting section 357 is a surface mount section. Although any surface mount termination could be used, FIG. 7a shows the preferred contact 303 capable of surface mounting to motherboard M using BGA technology. Furthermore, other mounting techniques (e.g. pin-in-paste, press-fit) could be used. International Publication numbers WO 98/15989 and WO 98/15991, herein incorporated by reference, describe methods of securing a solder mass 309, such as a fusible solder ball, to a contact retained by an insulative housing and to a pad on a circuit substrate.

Preferably, constructing contact housing sub-assembly 301 involves the following. First, spacer 305 and contact housing 307 are stacked so that posts 367 enter and engage openings 369. When stacked, peripheral recess 365 of spacer 305 rests on the upper surface of peripheral wall 337 and the bottom surface of base 311 of spacer 305 rests on the upper surface of base 333 of contact housing 307.

Second, contacts 303 are inserted into apertures 313, 335 until shoulders 359 abut the tapered lead-in of aperture 335 of contact housing 307. In that position, beams 343, 345 extend upwardly from spacer 305 and mounting portion 357 extends downwardly from contact housing 307.

Finally, solder mass 309 is secured to contact 303 using, for example, the re-flow techniques described in International Publication numbers WO 98/15989 and WO 98/15991. The combination of shoulder 357 of contact 303 abutting the tapered lead-in of aperture 313 and of solder mass 309 securing to mounting end 357 of contact 303 serves to lock connector housing sub-assembly 301 together.

Figure 3A:
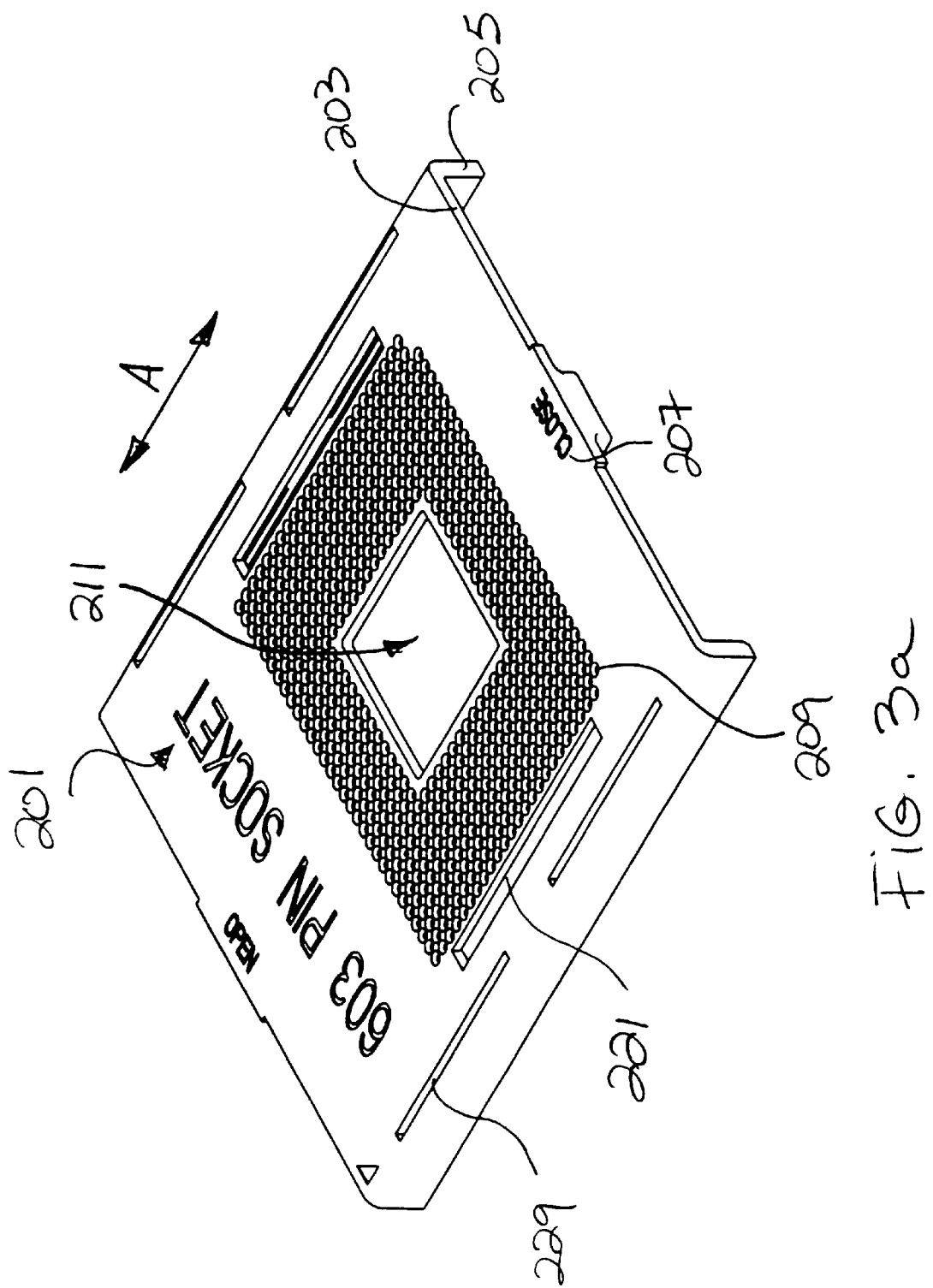
Figure 3B:
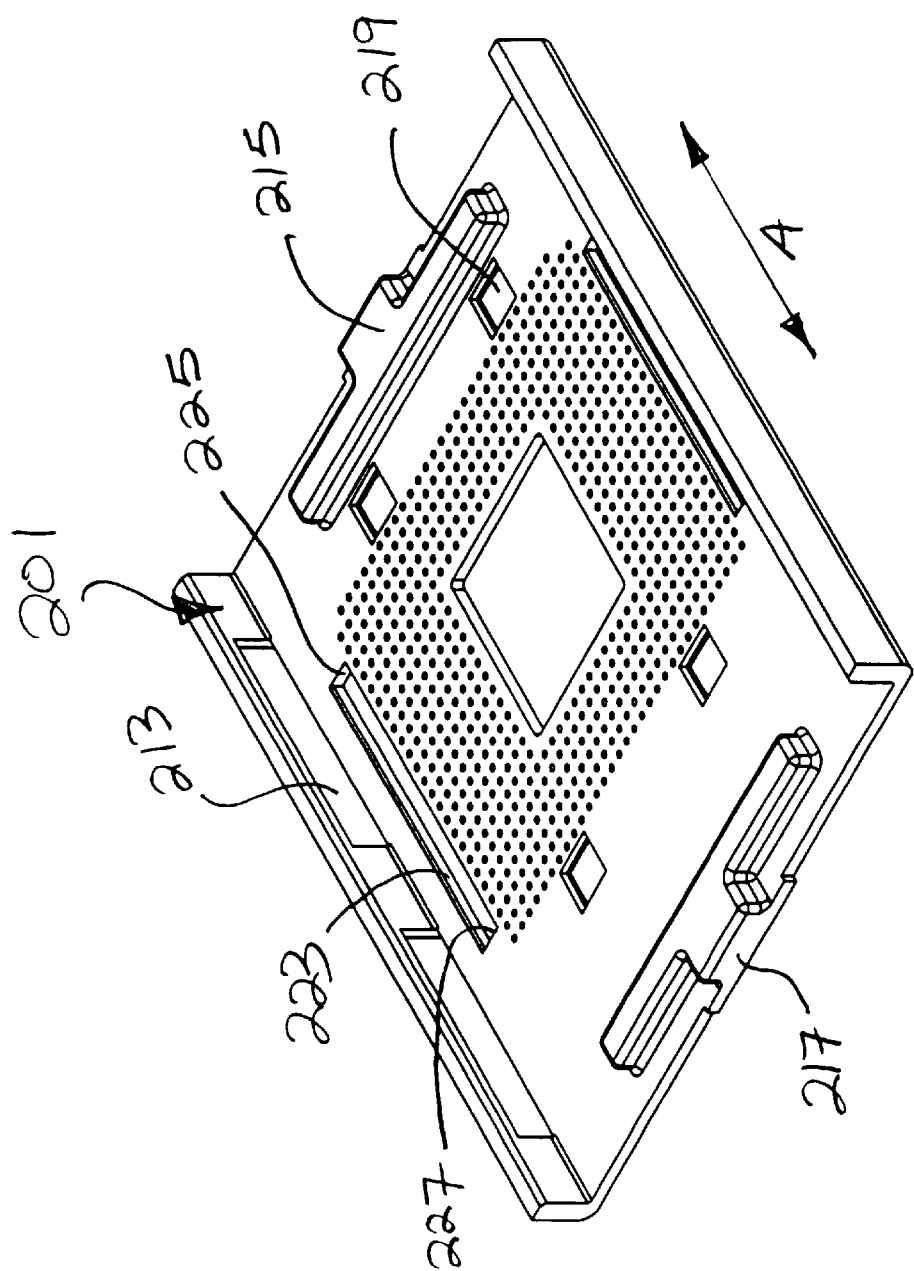

FIGS. 3a and 3b display cover 201. Preferably made from a suitable insulative material such as a high temperature thermoplastic, cover 201 has an upper wall 203 and opposed sidewalls 205. Since cover 201 must move across base frame 401, the longitudinal axes of sidewalls 205 define the actuation direction indicated by line A. The top surface of upper wall 203 could include printed indicia 207 to assist the socket actuation process discussed below.

Upper wall 203 receives interposer I. Upper wall 203 includes a plurality of apertures 209 sized large enough to allow corresponding interposer pins P to pass freely therethrough, but sized small enough to provide lateral support to pins P during mating with contacts 303. The pattern of apertures 209 on cover 201 corresponds to the pattern of interposer pins P. The present invention could, however, have patterns arranged differently than that shown in FIG. 3a in order to receive other interposers (such as for example an interposer with an interstitial pin grid array). If designed for one specific interposer, the number of apertures 209 preferably equals the number of interposer pins. In order to, for example, accommodate interposers with differing pin counts, socket 100 could have more apertures 209 than interposer pins P.

As seen in FIG. 3a, cover 201 could include a central opening 211. Generally, cover 201 could have central opening 211 when the interposer provides pins only along its periphery (ie. no pins at the center). Central opening 211 improves heat dissipation through socket 100 and helps make cover 201 more flexible. Sidewalls 205 preferably act as latches to secure cover 201 to base frame 401. Assembling socket 100 involves snap fitting sidewalls 205 over latch structure on base frame 401. In order to allow cover 201 to snap fit onto base frame 401, upper wall 203 could include relief slits 229.

Once properly fitted over base frame 401, recesses 213 on the inner surfaces of sidewalls 205 can accept the latch structure on base frame 401 without interference. Recesses 213 communicate with slits 229 in upper wall 203. The lower surface of upper wall 203 rests upon the upper surface of base frame 401 when cover 201 successfully latches to base frame 401. The latch structure on base frame 401 freely travels within recesses 213 during actuation of socket 100 between an open and a closed position. In other words, the latch structure generally does not interfere with the sidewalls that define recesses 213. This loose coupling, along with the loose coupling of the various sub-assemblies of socket 100, helps prevent stresses from building up in the solder joints. The latch structure, while not interfering with recesses 213, is sized so as to ensure proper alignment between cover 201 and base frame 401.

Ribs 215 extend from a bottom surface of upper wall 203 as seen in FIG. 3b. Ribs 215 each have an outwardly directed face 217. Face 217 engages actuating tool T used to urge socket 100 between the open and closed positions. Ribs 215 reside within correspondingly shaped openings in base frame 401 to aid in aligning cover 201 and contact housing sub-assembly 301 without interference. The bottom surface of upper wall 203 also includes channels 219. Channels 219 accept projections that extend upwardly from base frame 401. The projections travel freely within channels 219 as socket moves between the open and closed positions. In other words, the projections generally do not interfere with the sidewalls defining channels 219. While not interfering with channels, the projections do ensure adequate alignment between cover 201 and base frame 401. Although shown in FIG. 3b as only a recess in cover 201, channels 219 could extend entirely through upper wall 203 of cover 201.

Upper wall 203 also has keyways 221. Keyways 221 accept splines extending from contact housing sub-assembly 301 without interference. Keyways 221 have a guidance surface 223 extending between opposed stop surfaces 225, 227. A corresponding surface on each spline abuts guidance surface 223 to ensure proper alignment between cover 201 (and, necessarily, interposer pins P) and contact housing sub-assembly (and, necessarily, the contacts) as socket 100 travels between the open and closed position.

In the closed position, a corresponding surface of each spline abuts stop surface 225. In the open position, an opposite surface of each spline abuts stop surface 227. In other words, stop surfaces 225, 227 determine the travel limits of cover 201, while guidance surface 223 maintains alignment during movement. In order to have suitable flexibility, cover 201 could be manufactured as follows. Cover 201 could be injection molded using a liquid crystal polymer (LCP). Upper wall 203, which has a an array of apertures 209 with 0.050" centerline spacing that receive 0.12" diameter interposer pins P, could have a thickness of approximately 1.00 mm. In addition, the thickness of sidewalls 205 could be 1.75 mm.

FIGS. 8a and 8b display base frame 401. As with the other components of socket 100, base frame 401 is made from a suitable insulative material such as a high temperature thermoplastic. In order to have sufficient flexibility, base frame 401 has a generally rectangular shape with a central opening 403 along with various recessed areas. Base frame 401 secures to motherboard M independently of contact housing sub-assembly 301. Specifically, a lower surface of base frame 401 can have solder pads 431 to surface mount to motherboard M.

Figure 10A:
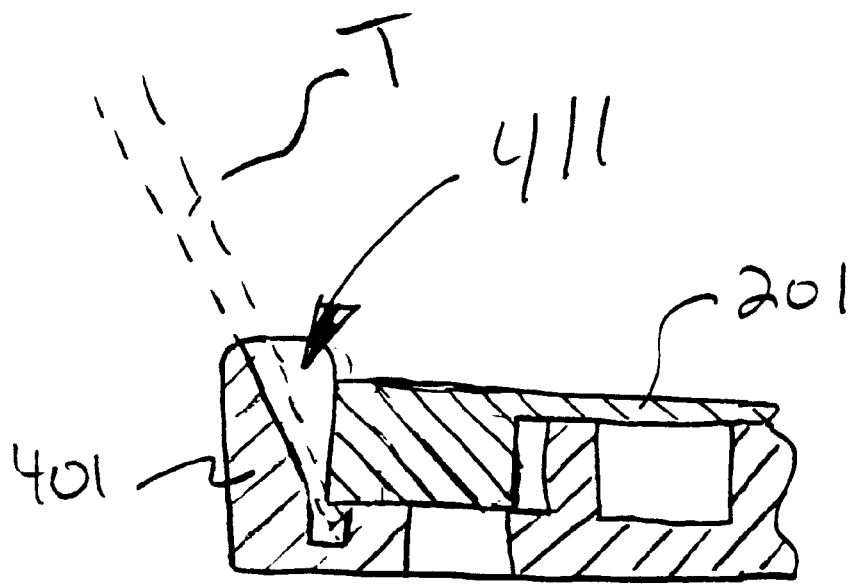
Figure 10B:
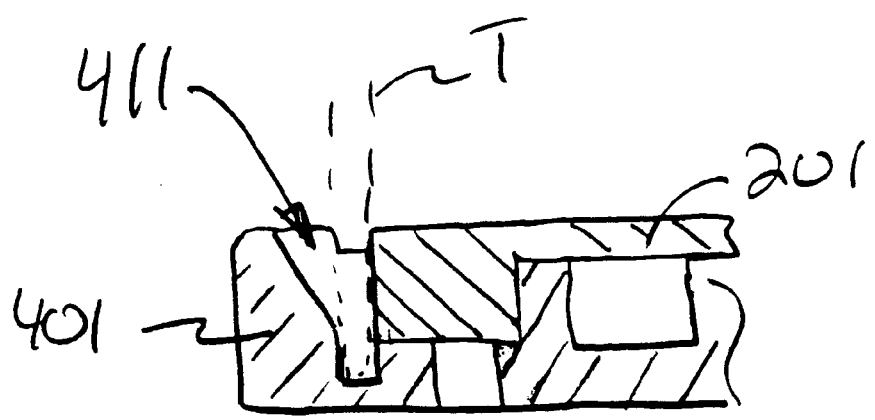

Opposed ends of base frame 401 each include an opening 405 that receives a corresponding rib 215 on cover 201. Openings 405 are appropriately sized to allow ribs 215 to travel freely therein as socket 100 travels between an open and a closed position. Opening 405 communicates with a notch 407. A projection 409 extends from base frame 401 and encloses notch 407. When cover 201 snap fits onto base frame 401, openings 411 form between an edge of cover 201 and projection 409. As seen in FIGS. 10a and 10b, openings 411 are sized to allow entry of tool T to actuate socket 100. Tool T enters and engages a bottom surface of opening 411. The bottom surface of opening 411 provides the leverage point for tool T to move cover 201. Since base frame 401 secures to motherboard M separately from contact housing sub-assembly 301, any forces caused by tool T during actuation so not transfer to contact housing sub-assembly 301.

Figure 9A:
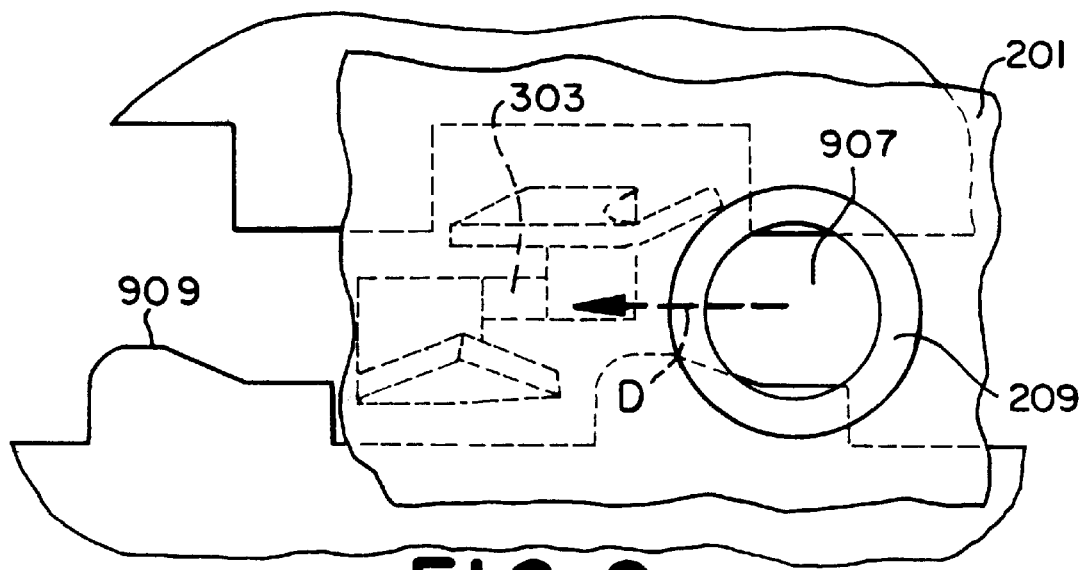
FIGS. 9a and 10a are a detailed view and a cross-sectional view (taken along line Xa—Xa), respectively, of the electrical connector in FIG. 1a in an open position.
Figure 9B:
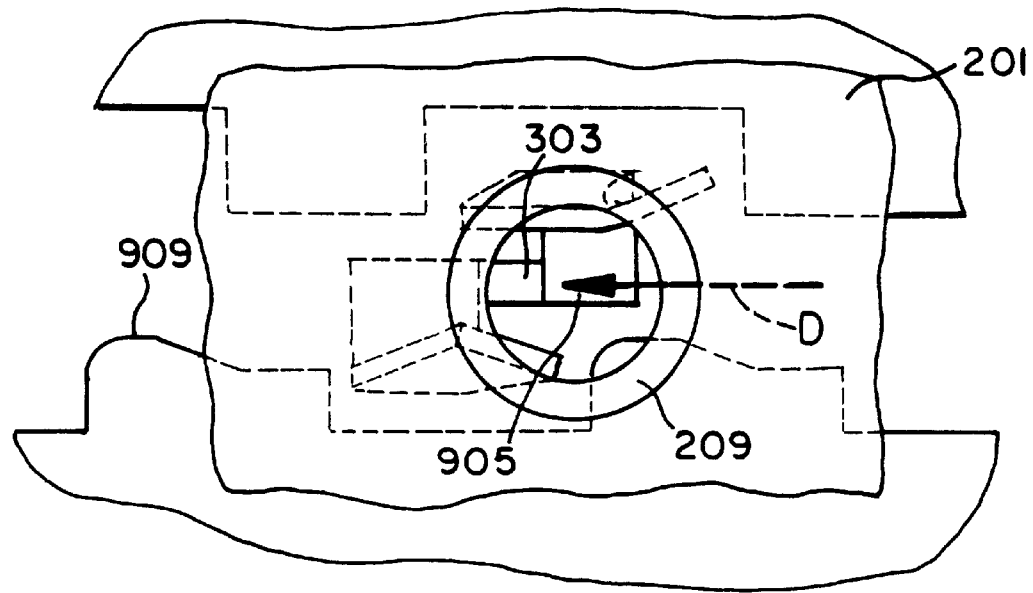
FIGS. 9b and 10b are a detailed view and a cross-sectional view (taken along line Xa—Xa) of the electrical connector in FIG. 1a in a closed position.

Rotation of tool T moves cover 201 along base frame 401. As shown in FIG. 9a, when socket 100 is in an open position, each pin P can freely enter corresponding aperture 209 and the pin-receiving portion 907 of the corresponding aperture 903 thereunder. Upon actuation of socket 100 to a closed position as shown in FIG. 9b, each pin P moves along its pin path D into the aforementioned positive resting position with its corresponding contact 303 in the manner set forth above.

Referring again to FIGS. 8a and 8b, the inner walls of base frame 401 that define central opening 403 include various features that help retain the contact housing sub-assembly 301 in base frame 401. One set of opposite walls include ledges 413. Contact housing sub-assembly 301 specifically contacts housing 307 by resting on the upper surfaces of ledges 413. In other words, ledges 413 prevent contact housing sub-assembly 301 from exiting base frame 401.

The other set of opposing walls has latching structures 417. During insertion of contact housing sub-assembly 301 into base frame 401, the reduced thickness portions of peripheral wall 315 and tapered surface 419 engage one another and deflect. Upon complete insertion, the reduced thickness portion of spacer 305 and tapered surface 419 resile to their normal, unloaded position. Once snap-fitted onto base frame 401, the upper surface of peripheral wall 315 abuts lower surface 421. In other words, latching structures 417 prevent contact housing sub-assembly 301 from exiting base frame 401.

As seen in FIG. 8a, only ledges 413 and latching structure 417 retain contact housing sub-assembly 301 on base frame 401. In addition, contact housing sub-assembly 301 fits within base frame 401 without interference. This loose coupling between base frame 401 and contact housing sub-assembly 301 helps prevent stresses from accumulating in the solder joints. The inner walls of base frame 401 that define central opening 403 also include notches 415 that can accommodate splines 325. Although contact housing sub-assembly nests within base frame 401, splines 325 extend past the upper surface of base frame 401. This allows splines 325 to enter keyways 221 in cover 201.

The inner walls of base frame 401 also include notches 423 flanked by latching structures 417. Notches 423 receive blocks 319 on contact housing sub-assembly 301. Blocks 319, however, do not extend past the upper surface of base frame 401. Blocks 319 and splines 325 are not interference fitted in to notches 423, 415, respectively. Notches 415, 423 do, however, provide guidance to contact housing sub-assembly 301. Each opposite side of the outer edge of base frame 401 includes latching structure 425. Latching structure 425 retains cover 201 on base frame 401. Sidewalls 205 of cover 201 deflect upon engaging tapered walls 427 of latching structures 425. Upon full engagement, sidewalls 205 resile to their normal position, with the walls that define recesses 213 engaging lower surface 429. In this position, cover 201 is secured to base frame 401, but movable relative there-along between the open and closed position.

While the present invention has been described in connection with the embodiments shown in the drawings, it is to be understood that other similar embodiments may be employed or modifications and additions may be made to the described embodiments for performing the same function of the present invention without deviating therefrom. Therefore, the present invention should not be limited to any single embodiment, but rather should be construed in breadth and scope in accordance with the recitation of the appended claims.

What is claimed is:

1. An electrical connector for retaining a generally longitudinally extending pin therein, the connector comprising:

a base having a surface and defining an aperture extending from the surface thereinto, the aperture having a contact-receiving portion and a pin-receiving portion arranged adjacent one another along the surface, the pin being initially received in the pin-receiving portion and then being moved along a pin path generally parallel to the surface into the contact-receiving portion, the base further having a protrusion extending into the aperture from a first side of the pin path; and a contact retained within the contact-receiving portion and having first and second beams, the first beam having a first-contacted surface generally residing on a second side of the pin path generally opposite the first side thereof, the first-contacted surface being relatively closer to the protrusion along the pin path and being contacted by the pin first as the pin moves toward the contact-receiving portion, the second beam having a second-contacted surface generally residing on the first side of the pin path, the second-contacted surface being relatively farther from the protrusion along the pin path and being contacted by the pin second and after the pin contacts the first-contacted surface as the pin moves toward the contact-receiving portion, the contact and base in combination defining a positive resting position for the pin such that the pin at the positive resting position is in contact with the first beam, the second beam, and the protrusion.

2. The connector of claim 1 wherein the pin at the positive resting position is contacted by each of the first beam, the second beam, and the protrusion at approximately a common longitudinal height.

3. The connector of claim 1 wherein the pin engages the second-contacted surface of the second beam after engaging the protrusion and the first-contacted surface of the first beam.

4. The connector of claim 1 wherein the protrusion generally defining the contact-receiving portion and the pin-receiving portion.

5. The connector of claim 1 wherein the protrusion has an initially-contacted surface facing generally toward the pin-receiving portion and a resting-contacted surface facing generally toward the contact-receiving portion, and wherein the pin moving along the pin path from the pin-receiving portion toward the contact-receiving portion initially contacts the initially-contacted surface of the protrusion and comes to rest at a positive resting position defined by being in contact with the first-contacted surface of the first beam, the second-contacted surface of the second beam, and the resting-contacted surface of the protrusion.

6. The connector of claim 1 wherein the contact-receiving portion has a lower section relatively farther from the surface and an upper section relatively closer to the surface, wherein the pin-receiving portion is relatively closer to the surface and is in communication with the upper section of the contact-receiving portion, wherein the pin is moved along the pin path into the upper-section of the contact-receiving portion, and wherein the contact has a main body frictionally retained within the lower section of the contact-receiving portion and the first and second beams extend from the main body into the upper section of the contact-receiving portion.

7. The connector of claim 1 wherein the pin moves in a direction generally perpendicular to the base during initial reception thereof in the pin-receiving portion.

8. The connector of claim 1 wherein the pin path is generally linear.

9. The connector of claim 1 wherein the first-contacted surface has a first portion generally at an angle to the pin path and relatively closer to the protrusion along the pin path, and a second portion generally parallel to the pin path and relatively farther from the protrusion along the pin path, and wherein the second-contacted surface is generally at an angle to the pin path.

10. The connector of claim 9 wherein the pin is retained at a positive resting position defined by being in contact with the second portion of the first-contacted surface of the first beam, the second-contacted surface of the second beam, and the protrusion.

11. The connector of claim 10 wherein the pin moving along the pin path from the pin-receiving portion toward the contact-receiving portion initially contacts the protrusion, then contacts the first portion of the first-contacted surface of the first beam, then contacts the second portion of the first-contacted surface of the first beam, then contacts the second-contacted surface of the second beam, then comes to rest at the positive resting position.

12. A contact for use in an electrical connector for retaining a generally longitudinally extending pin therein, the connector comprising a base having a surface and defining an aperture extending from the surface thereinto, the aperture having a contact-receiving portion and a pin-receiving portion arranged adjacent one another along the surface, the pin being initially received in the pin-receiving portion and then being moved along a pin path generally parallel to the surface into the contact-receiving portion, the base further having a protrusion extending into the aperture from a first side of the pin path in a direction generally perpendicular thereto;

the contact being retained within the contact-receiving portion and having first and second beams, the first beam having a first-contacted surface generally residing on a second side of the pin path generally opposite the first side thereof, the first-contacted surface being relatively closer to the protrusion along the pin path and being contacted by the pin first as the pin moves toward the contact-receiving portion, the second beam having a second-contacted surface generally residing on the first side of the pin path, the second-contacted surface being relatively farther from the protrusion along the pin path and being contacted by the pin second and after the pin contacts the first-contacted surface as the pin moves toward the contact-receiving portion, the contact in combination with the base defining a positive resting position for the pin such that the pin at the positive resting position is in contact with the first beam, the second beam, and the protrusion.

13. The contact of claim 12 wherein the pin at the positive resting position is contacted by each of the first beam, the second beam, and the protrusion at approximately a common longitudinal height.

14. The contact of claim 12 wherein the pin engages the second-contacted surface of the second beam after engaging the protrusion and the first-contacted surface of the first beam.

15. The contact of claim 12 wherein the protrusion has an initially-contacted surface facing generally toward the pin-receiving portion and a resting-contacted surface facing generally toward the contact-receiving portion, and wherein the pin moving along the pin path from the pin-receiving portion toward the contact-receiving portion initially contacts the initially-contacted surface of the protrusion and comes to rest at a positive resting position defined by being in contact with the first-contacted surface of the first beam, the second-contacted surface of the second beam, and the resting-contacted surface of the protrusion.

16. The contact of claim 12 wherein the contact-receiving portion has a lower section relatively farther from the surface and an upper section relatively closer to the surface, wherein the pin-receiving portion is relatively closer to the surface and is in communication with the upper section of the contact-receiving portion, wherein the pin is moved along the pin path into the upper-section of the contact-receiving portion, and wherein the contact has a main body frictionally retained within the lower section of the contact-receiving portion and the first and second beams extend from the main body into the upper section of the contact-receiving portion.

17. The contact of claim 12 wherein the first-contacted surface has a first portion generally at an angle to the pin path and relatively closer to the protrusion along the pin path, and a second portion generally parallel to the pin path and relatively farther from the protrusion along the pin path, and wherein the second-contacted surface is generally at an angle to the pin path.

18. The contact of claim 17 wherein the pin is retained at a positive resting position defined by being in contact with the second portion of the first-contacted surface of the first beam, the second-contacted surface of the second beam, and the protrusion.

19. The contact of claim 18 wherein the pin moving along the pin path from the pin-receiving portion toward the contact-receiving portion initially contacts the protrusion, then contacts the first portion of the first-contacted surface of the first beam, then contacts the second portion of the first-contacted surface of the first beam, then contacts the second-contacted surface of the second beam, then comes to rest at the positive resting position.

* * * * *